United States Patent
Honda

(10) Patent No.: US 10,425,624 B2
(45) Date of Patent: Sep. 24, 2019

(54) SOLID-STATE IMAGE CAPTURING DEVICE AND ELECTRONIC DEVICE

(71) Applicant: SONY CORPORATION, Tokyo (JP)

(72) Inventor: Motonari Honda, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 15/579,285

(22) PCT Filed: May 27, 2016

(86) PCT No.: PCT/JP2016/065678
§ 371 (c)(1),
(2) Date: Dec. 4, 2017

(87) PCT Pub. No.: WO2016/199594
PCT Pub. Date: Dec. 15, 2016

(65) Prior Publication Data
US 2018/0302597 A1    Oct. 18, 2018

(30) Foreign Application Priority Data
Jun. 10, 2015   (JP) .................................. 2015-117625

(51) Int. Cl.
*H04N 9/04*   (2006.01)
*H01L 27/14*   (2006.01)
(Continued)

(52) U.S. Cl.
CPC ............ *H04N 9/045* (2013.01); *G02B 5/201* (2013.01); *G02B 5/3058* (2013.01); *H01L 27/14* (2013.01);
(Continued)

(58) Field of Classification Search
CPC .... G02B 3/0006; G02B 5/3058; G02B 5/201; H04N 9/045; H04N 9/77; H04N 5/3745;
(Continued)

(56) References Cited

U.S. PATENT DOCUMENTS 7,760,256 B2 *   7/2010   Kanamori .............. H04N 9/045
                                                         348/222.1
8,564,700 B2 *   10/2013   Kanamori ......... H01L 27/14621
                                                         348/273
(Continued)

FOREIGN PATENT DOCUMENTS

JP    2007-189085    7/2007
JP    2007-287891    11/2007
(Continued)

OTHER PUBLICATIONS

International Search Report prepared by the Japan Patent Office dated Jun. 22, 2016, for International Application No. PCT/JP2016/065678.

*Primary Examiner* — Pritham D Prabhakher
(74) *Attorney, Agent, or Firm* — Sheridan Ross P.C.

(57) ABSTRACT

The present technology relates to a solid-state image capturing device and an electronic device which are capable of improving detection accuracy for polarization information and color information. The solid-state image capturing device includes a pixel array unit including a plurality of polarizing pixels configured to detect polarization information, and a plurality of color pixels configured to detect color information. The polarizing pixels are arranged in a row direction and a column direction in a grid form. The color pixels are arranged in the row direction and the column direction in the grid form between the polarizing pixels that are adjacent, at positions shifted from the polarizing pixels in the row direction and the column direction. For example, the present technology can be applied to the solid-state image capturing device.

15 Claims, 16 Drawing Sheets

(51) Int. Cl.
   *H01L 27/146*   (2006.01)
   *H04N 5/369*    (2011.01)
   *H04N 5/3745*   (2011.01)
   *H04N 9/77*     (2006.01)
   *G02B 5/20*     (2006.01)
   *G02B 5/30*     (2006.01)
   *G02B 3/00*     (2006.01)

(52) U.S. Cl.
   CPC .... *H01L 27/1463* (2013.01); *H01L 27/14607* (2013.01); *H01L 27/14621* (2013.01); *H01L 27/14623* (2013.01); *H01L 27/14625* (2013.01); *H01L 27/14627* (2013.01); *H01L 27/14645* (2013.01); *H04N 5/3696* (2013.01); *H04N 5/3745* (2013.01); *H04N 9/77* (2013.01); *G02B 3/0006* (2013.01); *H01L 27/1464* (2013.01)

(58) Field of Classification Search
   CPC ....................... H04N 5/3696; H04N 2209/046; H01L 27/14; H01L 27/14627; H01L 27/14607; H01L 27/14621; H01L 27/14623; H01L 27/14625; H01L 27/14645; H01L 27/1463
   USPC ....................................................... 348/294
   See application file for complete search history.

(56) References Cited

U.S. PATENT DOCUMENTS

| | | | |
|---|---|---|---|
| 9,601,532 B2 * | 3/2017 | Kanamori | ............ G02B 26/001 |
| 2009/0278954 A1 | 11/2009 | Kanamori | |
| 2009/0290039 A1 | 11/2009 | Kanamori | |
| 2010/0177221 A1 | 7/2010 | Lee | |
| 2010/0178018 A1 * | 7/2010 | Augusto | ................. G02B 6/12 385/131 |
| 2010/0253820 A1 | 10/2010 | Kanamori | |
| 2010/0282945 A1 * | 11/2010 | Yokogawa | ........ H01L 27/14621 250/208.1 |
| 2012/0075513 A1 | 3/2012 | Chipman | |
| 2013/0188023 A1 | 7/2013 | Kuang | |
| 2013/0242147 A1 | 9/2013 | Lee | |
| 2014/0293099 A1 | 10/2014 | Lee | |
| 2014/0346628 A1 | 11/2014 | Okazaki | |
| 2015/0035980 A1 * | 2/2015 | Krokel | ................... G01N 21/21 348/148 |
| 2015/0130962 A1 * | 5/2015 | Hiramoto | ............. H04N 5/2254 348/222.1 |
| 2015/0206912 A1 * | 7/2015 | Kanamori | ............. G02B 26/001 250/208.1 |
| 2015/0212294 A1 * | 7/2015 | Imamura | ................ G03B 13/36 348/345 |
| 2016/0195429 A1 * | 7/2016 | Boettiger | ............... G01J 1/0411 250/208.2 |

FOREIGN PATENT DOCUMENTS

| | | |
|---|---|---|
| JP | 2009-055624 | 3/2009 |
| JP | 2009-290895 | 12/2009 |
| JP | 2010-166580 | 7/2010 |
| JP | 2010-531540 | 9/2010 |
| JP | 2010-263158 | 11/2010 |
| JP | 2011-022432 | 2/2011 |
| JP | 2012-212978 | 11/2012 |
| JP | 2014-229810 | 12/2014 |
| WO | WO 2015/015722 | 2/2015 |

* cited by examiner

SOLID-STATE IMAGE CAPTURING DEVICE AND ELECTRONIC DEVICE

CROSS REFERENCE TO RELATED APPLICATIONS

This application is a national stage application under 35 U.S.C. 371 and claims the benefit of PCT Application No. PCT/JP2016/065678 having an international filing date of 27 May 2016, which designated the United States, which PCT application claimed the benefit of Japanese Patent Application No. 2015-117625 filed 10 Jun. 2015, the disclosures of which are incorporated herein by reference in their entirety.

TECHNICAL FIELD

The present technology relates to a solid-state image capturing device and an electronic device, and more particularly, to a solid-state image capturing device and an electronic device which are capable of improving detection accuracy for polarization information and color information.

BACKGROUND ART

In the past, a solid-state image capturing device in which polarizing pixels including a polarizing member are arranged in a pixel block of a 2×2 matrix instead of color pixels including a color filter, and polarization information and color information are detected at the same time has been proposed (for example, see Patent Literature 1).

CITATION LIST

Patent Literature

Patent Literature 1: JP 2010-263158A

DISCLOSURE OF INVENTION

Technical Problem

However, if the polarizing pixels are arranged instead of the color pixels, the color pixels are thinned out accordingly, and thus the detection accuracy for the color information decreases. Further, in the invention described in Patent Literature 1, since only one polarizing pixel is arranged for four pixels, there is room for improvement in the detection accuracy for the polarization information.

In this regard, the present technology makes it possible to improve the detection accuracy for the polarization information and the color information.

Solution to Problem

According to a first aspect of the present technology, a solid-state image capturing device includes a pixel array unit including a plurality of polarizing pixels configured to detect polarization information, and a plurality of color pixels configured to detect color information. The polarizing pixels are arranged in a row direction and a column direction in a grid form. The color pixels are arranged in the row direction and the column direction in the grid form between the polarizing pixels that are adjacent, at positions shifted from the polarizing pixels in the row direction and the column direction.

Sizes of the polarizing pixels may be different from sizes of the color pixels.

The larger pixels among the polarizing pixels and the color pixels may each have an octagonal shape made by cutting four corners of a rectangle. The smaller pixels among the polarizing pixels and the color pixels may be each arranged in a region surrounded by sides of four adjacent larger pixels in oblique directions.

The polarizing pixels and the color pixels may have rhombic shapes of the same size.

The 180/θ number of types of the polarizing pixels in which angles of transmission axes differ by θ° may be regularly arranged.

Blocks each in which the polarizing pixels in which the angles of the transmission axes differ by 45° may be arranged in a 2×2 matrix form are arranged in the row direction and the column direction in the grid form.

A plurality of types of blocks each including a plurality of polarizing pixels may be regularly arranged. The angles of the transmission axes of the polarizing pixels in the block may be the same, and the angles of the transmission axes of the polarizing pixels of different types of blocks may be different.

Color filters m installed in the polarizing pixels, and colors of the color filters may be regularly arranged.

A plurality of types of blocks each including a plurality of the polarizing pixels may be regularly arranged. The colors of the color filters in the block may be the same, and the colors of the color filters of different types of blocks may be different.

The color filter that is transparent may be installed or may not be installed in a part of the polarizing pixels.

Polarizing members installed in the polarizing pixels and color filters installed in the color pixel may be arranged on the same plane.

Polarizing members installed in the polarizing pixels and color filters installed in the color pixels may be arranged at different positions in an optical axis direction.

Polarizing members installed in the polarizing pixels may be formed on a surface of a side of a semiconductor substrate on which light is incident, photoelectric conversion elements of the polarizing pixels being formed in the semiconductor substrate.

A waveguide may be formed in at least one of a space between a polarizing member and a photoelectric conversion element constituting the polarizing pixel and a space between a color filter and a photoelectric conversion element constituting the color pixel.

A trench may be formed between pixels, and a light shielding film may be embedded in the trench.

The polarizing pixels and the color pixels may be connected to different row signal lines and different column signal lines.

The color pixels may be arranged at positions shifted from the polarizing pixels in the row direction and the column direction by half of a pitch of the polarizing pixels.

The solid-state image capturing device may further include a signal processing unit configured to calculate luminance of light in each polarization direction in the color pixels on the basis of luminance of a plurality of the polarizing pixels around the color pixels.

The solid-state image capturing device may further include a signal processing unit configured to calculate luminance of light of each color of the polarizing pixels in a polarization direction in the polarizing pixels on the basis of luminance of a plurality of the color pixels around the polarizing pixels.

According to a second aspect of the present technology, an electronic device includes: a solid-state image capturing device; a signal processing unit configured to process a signal output from the solid-state image capturing device. The solid-state image capturing device includes a pixel array unit including a plurality of polarizing pixels configured to detect polarization information, and a plurality of color pixels configured to detect color information. The polarizing pixels are arranged in a row direction and a column direction in a grid form. The color pixels are arranged in the row direction and the column direction in the grid form between the polarizing pixels that are adjacent, at positions shifted from the polarizing pixels in the row direction and the column direction.

In the first aspect or the second aspect of the present technology, the polarization information is detected by the polarizing pixels, and the color information is detected by the color pixels.

Advantageous Effects of Invention

According to the first aspect or the second aspect of the present technology, the detection accuracy for the polarization information and the color information is improved.

The effects are not necessarily limited to those described here, and any effects described in the present disclosure may be included.

MODE(S) FOR CARRYING OUT THE INVENTION

Hereinafter, embodiments (hereinafter referred to as "embodiments") of the invention will be described in detail with reference to the accompanying drawings. The description will proceed in the following order.

1. Solid-state image capturing device to which present technology is applied
2. First embodiment (example of back surface irradiation type with polarizing pixel and color pixel of equal size)
3. Second embodiment (example of back surface irradiation type with polarizing pixel and color pixel of different sizes)
4. Third embodiment (example in which color filter is installed in polarizing pixel)
5. Fourth embodiment (example of top surface irradiation type)
6. Modified examples
7. Use examples of solid-state image capturing device <1. Solid-state Image Capturing Device to which Present Technology is Applied>
{Basic System Configuration}

Figure 1:
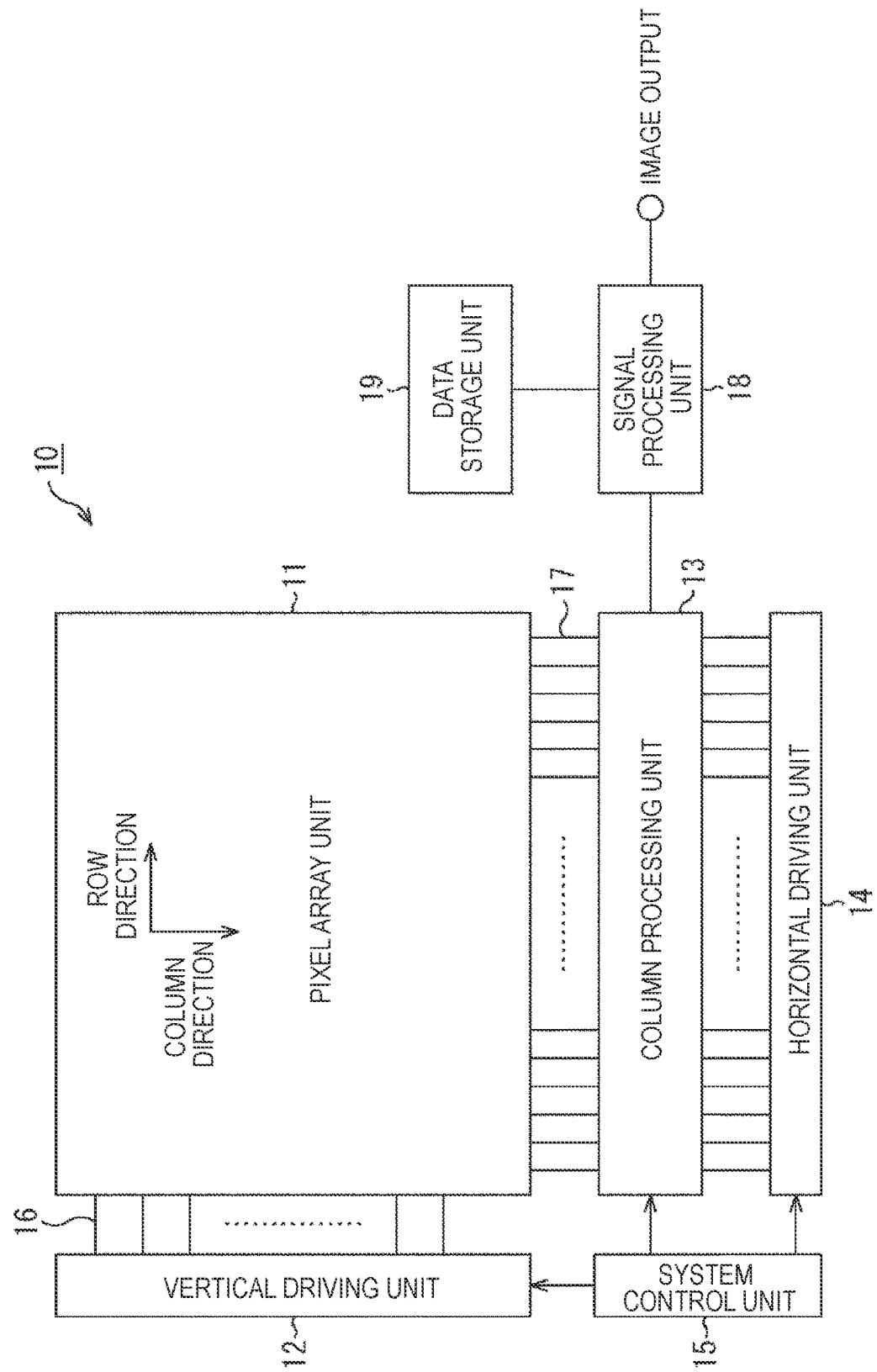
FIG. 1 is a system configuration diagram illustrating an overview of a configuration of a CMOS image sensor to which the present technology is applied.

FIG. 1 is a system configuration diagram illustrating an overview of a configuration of a solid-state image capturing device, for example, a CMOS image sensor which is a sort of X-Y address type solid-state image capturing device, to which the present technology is applied. Here, the CMOS image sensor is an image sensor made by applying or partially using a CMOS process.

A CMOS image sensor 10 according to the present application example includes a pixel array unit 11 formed on a semiconductor substrate (chip) (not illustrated) and a peripheral circuit unit integrated on the same semiconductor substrate as the pixel array unit 11. The peripheral circuit unit includes, for example, a vertical driving unit 12, a column processing unit 13, a horizontal driving unit 14, and a system control unit 15.

The CMOS image sensor 10 further includes a signal processing unit 18 and a data storage unit 19. The signal processing unit 18 and the data storage unit 19 may be mounted on the same substrate as the CMOS image sensor 10 or may be arranged on a substrate separate from that of the CMOS image sensor 10. Further, processes of the signal processing unit 18 and the data storage unit 19 may be performed by an external signal processing unit, for example, a digital signal processor (DSP) circuit installed on a substrate separate from that of the CMOS image sensor 10 or software.

The pixel array unit 11 has a configuration in which a plurality of unit pixels (hereinafter also referred to simply as "pixels") are arranged in a row direction and a column direction. Here, the row direction refers to an arrangement direction of pixel in a pixel row (that is, a horizontal direction), and the column direction refers to an arrangement direction of pixel in a pixel column (that is, a vertical direction).

More specifically, as will be described later, unit pixels capable of detecting the polarization information (hereinafter referred to as "polarizing pixels") and unit pixels capable of detecting the color information (hereinafter referred to as "color pixels") are arranged in the pixel array unit 11. As will be described later with reference to FIG. 3 and the like, the polarizing pixels are arranged in the row direction and the column direction in a grid form (a matrix form), and the color pixels are arranged at positions shifted from the polarizing pixels in the row direction and in the column direction between the adjacent polarizing pixels in the row direction and the column direction in a grid form (a matrix form).

The unit pixel includes a photoelectric conversion unit (for example, a photodiode) that generates and accumulates electric charges in accordance with a received light amount and a plurality of pixel transistors (so-called MOS transistors). The plurality of pixel transistors may include three transistors, for example, a transfer transistor, a reset transistor, and an amplifying transistor. Alternatively, the plurality of pixel transistors may further include a selecting transistor, that is, four transistors. Since equivalent circuits of the pixels are the same as a general one, detailed description thereof will be omitted here.

The unit pixel may have a shared pixel structure. The shared pixel structure includes a plurality of photoelectric conversion elements, a plurality of transfer transistors, one shared floating diffusion, and another shared pixel transistor.

In the pixel array unit 11, a pixel drive line 16 serving as a row signal line is wired in the row direction for each pixel row, and a vertical signal line 17 serving as a column signal line is wired in the column direction for each pixel column. The pixel drive line 16 transmits a drive signal for performing driving when signals are read from the pixels. In FIG. 1, although the pixel drive line 16 is illustrated as one wiring, the pixel drive line 16 is not limited to one wiring. One terminal of the pixel drive line 16 is connected to an output terminal corresponding to each row of the vertical driving unit 12.

The vertical driving unit 12 is configured with a shift register, an address decoder, and the like, and drives the pixels of the pixel array unit 11 for all the pixels or in units of rows at the same time. In other words, the vertical driving unit 12 constitutes a driving unit that controls an operation of each of the pixels of the pixel array unit 11 together with the system control unit 15 that controls the vertical driving unit 12. Although a specific configuration of the vertical driving unit 12 is omitted, the vertical driving unit 12 commonly includes two scanning units, that is, a read scanning unit and a sweep scanning unit.

The read scanning unit sequentially selects and scans the unit pixels of the pixel array unit 11 in units of rows in order to read signals from the unit pixels. The signal read from the unit pixel is an analog signal. The sweep scanning unit performs sweep scanning on a reading row which is to undergo the read scanning performed by the read scanning unit ahead of the read scanning by a time corresponding to an exposure time.

Through the sweep scanning performed by the sweep scanning unit, unnecessary electric charges are swept from the photoelectric conversion unit of the unit pixel of the reading row, and the photoelectric conversion unit is reset. Then, as the unnecessary electric charges are swept (reset) by the sweep scanning unit, an electronic shutter operation is performed. Here, the electronic shutter operation refers to an operation of removing the electric charges of the photoelectric conversion unit and newly starting light exposure (starting accumulation of electric charges).

The signals read in accordance with the read operation performed by the read scanning unit correspond to an amount of light received after an immediately previous read operation or electronic shutter operation. A period from a read timing according to an immediately previous read operation or the sweep timing according to the electronic shutter operation to a read timing according to a current read operation is a charge exposure period in the unit pixel.

The signals output from the unit pixels of the pixel row selectively scanned by the vertical driving unit 12 are input to the column processing unit 13 via the vertical signal lines 17 for each pixel column. The column processing unit 13 performs predetermined signal processing on the signals output from the pixels of the selected row via the vertical signal line 17 for each pixel column of the pixel array unit 11 and temporarily holds the pixel signals which have undergone the signal processing.

Specifically, the column processing unit 13 performs at least a noise reduction process, for example, a correlated double sampling (CDS) process or a double data sampling (DDS) process, as the signal processing. For example, a reset noise or a fixed pattern noise specific to a pixel such as a threshold variation of the amplifying transistor within a pixel are removed through the CDS process. In addition to the noise reduction process, the column processing unit 13 may have, for example, an analog-digital (AD) conversion function and be able to convert an analog pixel signal into a digital signal and output the digital signal.

The horizontal driving unit 14 is configured with a shift register, an address decoder, and the like, and sequentially selects a unit circuit corresponding to the pixel column of the column processing unit 13. Through the selective scanning by the horizontal driving unit 14, the pixel signals which have undergone the signal processing for each unit circuit in the column processing unit 13 are sequentially output.

The system control unit 15 is configured with a timing generator that generates various timing signals or the like and performs driving control of the vertical driving unit 12, the column processing unit 13, the horizontal driving unit 14, and the like on the basis of the various timings generated by the timing generator.

The signal processing unit 18 has at least an operation processing function and performs various signal processing such as an operation process on the pixel signals output from the column processing unit 13. The data storage unit 19 temporarily stores data necessary for the processing in the signal processing in the signal processing unit 18.

<2. First Embodiment>

Next, a CMOS image sensor 10A which is the first embodiment of the CMOS image sensor 10 of FIG. 1 will be described with reference to FIGS. 2 to 4.

{Configuration Example of CMOS Image Sensor 10A}

Figure 2:
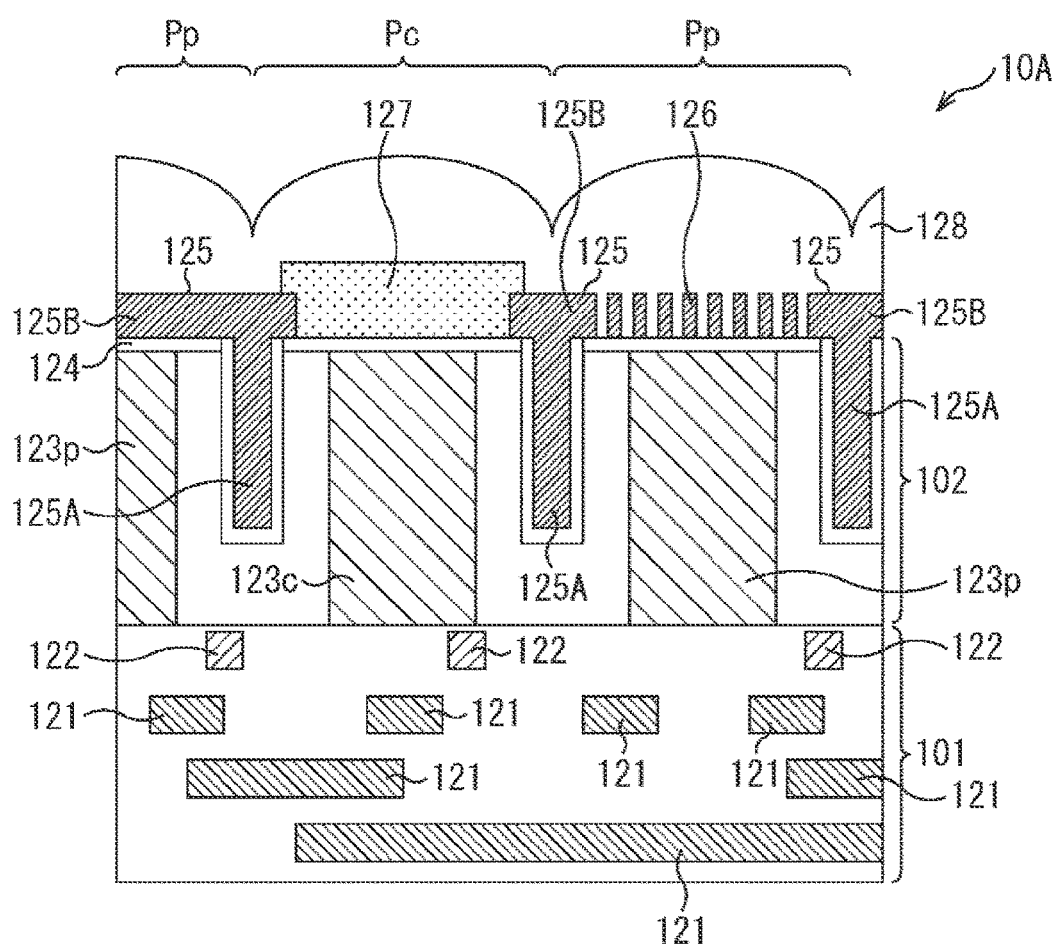
FIG. 2 is a cross-sectional view schematically illustrating a first embodiment of a CMOS image sensor.

FIG. 2 is a cross-sectional view schematically illustrating a configuration example of the CMOS image sensor 10A. A cross section of a portion including two pixels, that is, a polarizing pixel Pp and a color pixel Pc, is illustrated in FIG. 2, and the other pixels have basically the same configuration.

Here, a light incident side (an upper side in FIG. 2) is assumed to be an upper side above the CMOS image sensor 10A, and a side (a lower side in FIG. 2) opposite to the light incident side is assumed to be a lower side below the CMOS image sensor 10A.

The CMOS image sensor 10A has a back surface irradiation type structure in which light enters from a back surface opposite to a front surface on which a wiring layer 101 of a semiconductor substrate 102 is stacked. Hereinafter, the back surface of the semiconductor substrate 102 is referred to as an "incidence surface" or a "light receiving surface."

In the wiring layer 101, wirings 121 are stacked over a plurality of layers. A gate electrode 122 is formed for each pixel in the vicinity of the boundary of the wiring layer 101 with the semiconductor substrate 102.

In the semiconductor substrate 102, a photoelectric conversion element 123p is formed in an area of the polarizing pixel Pp, and a photoelectric conversion element 123c is formed in an area of the color pixel Pc. There is no structural difference between the photoelectric conversion element 123p and the photoelectric conversion element 123c, and each of the photoelectric conversion element 123p and the photoelectric conversion element 123c is configured with, for example, a photodiode. Further, the photoelectric conversion element 123p and the photoelectric conversion element 123c have substantially the same size.

Hereinafter, when it is unnecessary to distinguish the photoelectric conversion element 123p and the photoelectric conversion element 123c individually, they are referred to simply as a "photoelectric conversion element 123."

A trench extending from the incidence surface side of the semiconductor substrate 102 is formed between the photoelectric conversion elements 123. An insulating film 124 is formed on the incidence surface of the semiconductor substrate 102 and a wall surface of the trench. Further, a vertical portion 125A of the light shielding film 125 is embedded in the trench of the semiconductor substrate 102.

A horizontal portion 125B of the light shielding film 125, a polarizing member 126, and a color filter 127 are formed on the incidence surface of the semiconductor substrate 102 with the insulating film 124 interposed therebetween.

The horizontal portion 125B of the light shielding film 125 covers the incidence surface of the semiconductor substrate 102, and opening portions are formed above the photoelectric conversion element 123p and the photoelectric conversion element 123c. In other words, the horizontal portion 125B of the light shielding film 125 is formed to fill a space between the adjacent pixels. Incidence of light in an oblique direction from an adjacent pixel is suppressed by the vertical portion 125A and the horizontal portion 125B of the light shielding film 125.

The polarizing member 126 is formed in the opening portion above the photoelectric conversion element 123p of the horizontal portion 125B of the light shielding film 125 and covers a top surface (the incidence surface) of the photoelectric conversion element 123p. For example, the polarizing member 126 is configured with a wire grid polarizer and includes a plurality of band-like conductive light-shielding materials and slits formed therebetween. The polarizing member 126 transmits a polarized wave having an electric field component in a direction orthogonal to a direction in which the conductive light-shielding material extends and suppresses transmission of a polarized wave having an electric field component parallel to the direction in which the conductive light-shielding material extends. As the conductive light-shielding material of the polarizing member 126, for example, a conductive material having a small complex refractive index in a wavelength region in which the photoelectric conversion element 123 has sensitivity is used. As the conductive material, for example, aluminum, copper, gold, silver, platinum, tungsten, an alloy containing these metals, or the like can be considered.

The color filter 127 is formed in the opening portion above the photoelectric conversion element 123c of the horizontal portion 125B of the light shielding film 125 and covers the top surface (the incidence surface) of the photoelectric conversion element 123c. For example, the color filter 127 is configured with an R filter that transmits light of a red wavelength range, a G filter that transmits light of a green wavelength range, or a B filter that transmits light of a blue wavelength range.

A light collecting element 128 is formed above the horizontal portion 125B of the light shielding film 125, the polarizing member 126, and the color filter 127 with an interlayer insulating film interposed therebetween (not illustrated). For example, the light collecting element 128 is configured with an on-chip microlens, and collects light so that the incident light is incident on the polarizing member 126 or the color filter 127.

The light that has passed through the polarizing member 126 is incident on the photoelectric conversion element 123p and undergoes photoelectric conversion performed by the photoelectric conversion element 123p. Then, an analog electrical signal (polarized pixel signal) based on electric charges generated by the photoelectric conversion is output to the column processing unit 13 via the vertical signal line 17.

The light that has passed through the color filter 127 is incident on the photoelectric conversion element 123c and undergoes photoelectric conversion performed by the photoelectric conversion element 123c. Then, an analog electrical signal (color pixel signal) based on electric charges generated by the photoelectric conversion is output to the column processing unit 13 via the vertical signal line 17.

{First Array Example of Unit Pixels}

Figure 3:
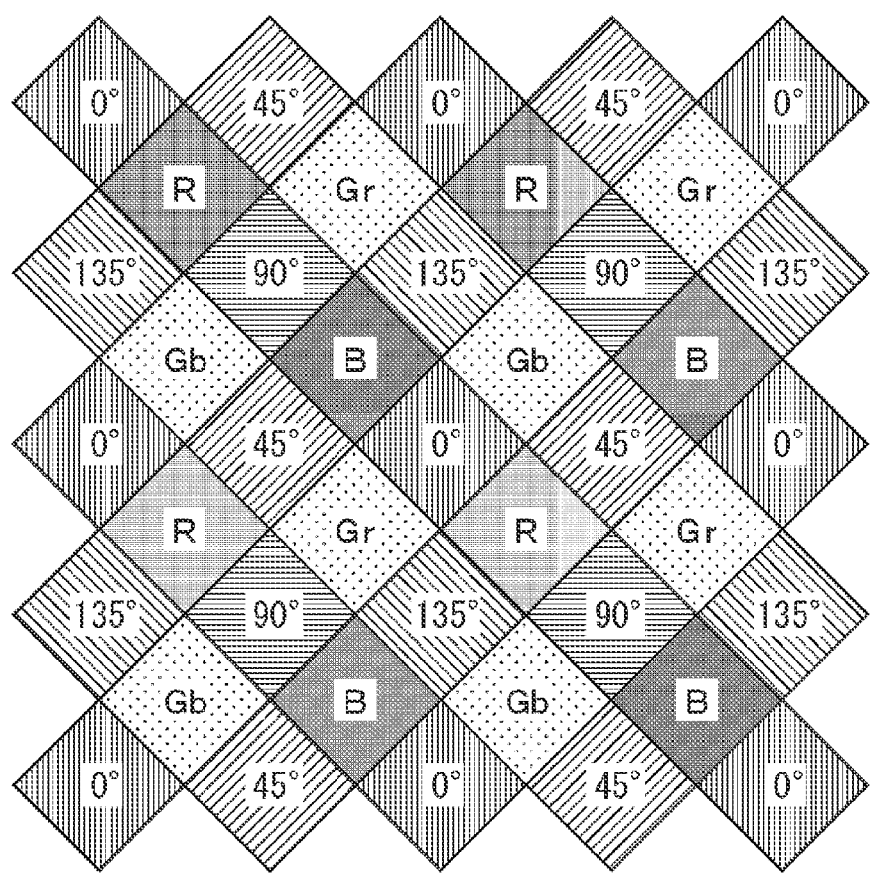
FIG. 3 is a diagram schematically illustrating a first array example of unit pixels.

FIG. 3 schematically illustrates a first array example of the unit pixels in the pixel array unit 11 of the CMOS image sensor 10A. Each square in FIG. 3 indicates a shape of the incidence surface (light receiving surface) of the pixel.

A pixel having an angle indicated in the square is the polarizing pixel Pp. The angle of each polarizing pixel Pp indicates an angle of the transmission axis of the polarizing member 126, and the angle is indicated clockwise with the column direction as a reference (0°). Each polarizing pixel Pp transmits light having a direction parallel to the transmission axis.

Hereinafter, polarizing pixels Pp in which the angles of the transmission axis of the polarizing member 126 are 0°, 45°, 90°, and 135° are referred to as a "0° pixel," a "45° pixel," a "90° pixel," and a "135° pixel," respectively. Hereinafter, the angle of the transmission axis of the polarizing member 126 is also referred to as a "polarization angle." Further, hereinafter, the polarization angle of the polarizing member 126 of the polarizing pixel Pp is also referred to as a "polarization angle of the polarizing pixel Pp."

On the other hand, pixels indicated by letters R, Gr, Gb, and B in the square are color pixels Pc. The pixel to which the letter R is attached is a color pixel Pc (hereinafter referred to as a "R pixel") which is provided with a red color filter 127 and capable of detecting the color information of the red wavelength range. The pixel to which the letter Gb is attached is a color pixel Pc (hereinafter referred to as a "Gb pixel") which is provided with a green color filter 127 and capable of detecting the color information of the green wavelength range. The pixel with the letter Gr is a color pixel Pc (hereinafter referred to as a "Gr pixel") which is provided with a green color filter 127 and capable of detecting the color information of the green wavelength range. The pixel to which the letter B is attached is a color pixel Pc (hereinafter referred to as a "B pixel") which is provided with a blue color filter 127 and capable of detecting the color information of the blue wavelength range.

Each of the polarizing pixel Pp and the color pixel Pc has a shape in which the square of the same size is tilted by 45° in the row direction and the column direction.

The polarizing pixels Pp are arranged in the row direction and the column direction in a grid form (a matrix form) so that a vertex thereof comes into contact with the adjacent polarizing pixel Pp. Further, a block in which the 0° pixel, the 45° pixel, the 90° pixel, and the 135° pixel having an angle difference of 45° therebetween are arranged in a 2×2 matrix is defined as one unit, and the blocks are periodically arranged in a grid form (a matrix form) in the row direction and the column direction.

The color pixel Pc is arranged in a gap between the polarizing pixels Pp. In other words, the color pixel Pc is a region surrounded by sides of the four adjacent polarizing pixels Pp in the oblique direction and arranged at a position shifted from the polarizing pixel Pp in the row direction and the column direction by a half of a pitch of the polarizing pixel Pp. Therefore, the polarizing pixels Pp and the color pixels Pc are arranged at positions shifted from each other by a ½ pitch in the row direction and the column direction in the grid form (the matrix form). Further, a block in which the R pixel, the Gb pixel, the Gr pixel, and the B pixel are arranged in a 2×2 matrix form is defined as one unit, and the blocks are periodically arranged in a grid form (a matrix form) in the row direction and the column direction, that is, the Bayer array is employed.

The four sides of each polarizing pixel Pp in the oblique direction are surrounded by the R pixel, the Gb pixel, the Gr pixel, and the B pixel. Further, the four sides of each color pixel Pc in the oblique direction are surrounded by the 0° pixel, the 45° pixel, the 90° pixel, and the 135° pixel.

The pixel drive line 16 in FIG. 1 is wired in the row direction for each pixel row of the polarizing pixel Pp and for each pixel row of the color pixel Pc. In other words, the polarizing pixel Pp and the color pixel Pc are connected to different pixel drive lines 16. Therefore, it is possible to separately drive the polarizing pixel Pp and the color pixel Pc in units of rows.

Further, the vertical signal line 17 of FIG. 1 is wired in the column direction for each pixel column of the polarizing pixel Pp and for each pixel column of the color pixel Pc. In other words, the polarizing pixel Pp and the color pixel Pc are connected to different vertical signal lines 17. Therefore, the pixel signal (polarized pixel signal) supplied from the polarizing pixel Pp and the pixel signal (the color pixel signal) supplied from the color pixel Pc can be read separately. Further, a polarized image configured with the polarized pixel signals supplied from the polarizing pixels Pp and a color image configured with the color pixel signals supplied from the color pixels Pc can be separately generated.

{Method of Interpolating Polarization Information and Color Information}

A polarization information interpolation method in the color image Pc and a color information interpolation method in the polarizing pixel Pp will now be described.

Hereinafter, a coordinate system of the polarizing pixel Pp and a coordinate system of the color pixel Pc are indicated by different coordinate systems. Further, coordinates (i, j) of the coordinate system of the polarizing pixel Pp is indicated by Pp(i, j), a polarization angle of the polarizing pixel Pp(i, j) is indicated by θ(i, j), and luminance of the polarizing pixel Pp(i, j) is indicated by Ip(i, j). The color pixel Pc having coordinates (m, n) in the coordinate system of the color pixel Pc is indicated by Pc(m, n). Further, luminance in a case in which the color pixel Pc(m, n) is the R pixel is indicated by Icr(m, n), luminance in a case in which the color pixel Pc(m, n) is the Gr pixel is indicated by Icgr(m, n), luminance in a case in which the color pixel Pc(m, n) is the Gb pixel is indicated by Icgb(m, n) and luminance in a case in which the color pixel Pc(m, n) is the B pixel is Icb(m, n).

First, an example of the polarization information interpolation method in the color pixel Pc(m, n) will be described. Hereinafter, the color pixels Pc(m, n) are assumed to be surrounded by the polarizing pixels Pp(i, j), Pp(i+1, j), Pp(i, j+1), and Pp(i+1, j+).

Here, the luminance Ip(m, n, θ) of light in the polarization direction θ in the color pixel Pc(m, n) is indicated by a mathematical model of the following Formula (1).

[Math. 1]

$$Ip(m, n, \theta) = \frac{I\max + I\min}{2} + \frac{I\max - I\min}{2}\cos(2\theta - 2\phi) \quad (1)$$

Imax indicates a maximum value of the luminance Ip(m, n, θ), and Imin indicates a minimum value of the luminance Ip(m, n, θ). φ indicates the polarization direction θ in a case in which the luminance Ip(m, n, θ) is Imax.

For example, the signal processing unit 18 performs a fitting process such as a least-square technique on the basis of luminances Ip(i, j), Ip(i+1, j), Ip(i, j+1), and Ip(i+1, j+1) and polarization angles θ(i, j), θ(i+1, j), θ(i, j+1), and θ(i+1, j+1) of the polarizing pixels Pp(i, j), Pp(i+1, j), Pp(i, j+1), and Pp(i+1, j+1) around the color pixel Pc(m, n), and estimates Imax, Imin, and φ of Formula (1) in the color pixel Pc(m, n). Accordingly, the signal processing unit 18 is able to obtain the luminance in each polarization direction θ in the color pixel Pc(m, n).

Further, the signal processing unit 18 is able to detect a normal direction of a subject in the color pixel Pc(m, n) on the basis of the luminance in each polarization direction θ in the color pixel Pc(m, n). Therefore, for example, the signal processing unit 18 is able to measure the shape of the subject by detecting the normal direction of the subject in each color pixel Pc.

Next, an example of the color information interpolation method in the polarizing pixel Pp(i, j) will be described. Hereinafter, the polarizing pixel Pp(i, j) is assumed to be surrounded by the color pixels Pc(m−1, n−1), Pc(m−1, n), Pc(m, n−1), and Pc(m, n). Further, the color pixels Pc(m−1, n−1), Pc(m−1, n), Pc(m, n−1), and Pc(m, n) are assumed to be the R pixel, the Gr pixel, the Gb pixel, and the B pixel.

The signal processing unit 18 calculates color polarization luminance Ipr(i, j) of a R component, color polarization luminance Ipg(i, j) of a G component, the color change luminance Ipb(i, j) of a B component in the polarizing pixel Pp(i, j) in accordance with the following Formulas (2) to (4).

[Math. 2]

$$Ipr(i, j) = Ip(i, j) \cdot \frac{2Icr(m-1, n-1)}{2Icr(m-1, n-1) + Icgr(m-1, n) + Icgb(m, n-1) + 2Icb(m, n)} \quad (2)$$

$$Ipg(i, j) = Ip(i, j) \cdot \frac{Icgr(m-1, n) + Icgb(m, n-1)}{2Icr(m-1, n-1) + Icgr(m-1, n) + Icgb(m, n-1) + 2Icb(m, n)} \quad (3)$$

$$Ipb(i, j) = Ip(i, j) \cdot \frac{2Icb(m, n)}{2Icr(m-1, n-1) + Icgr(m-1, n) + Icgb(m, n-1) + 2Icb(m, n)} \quad (4)$$

The color polarization luminance Ipr(i, j) is luminance of red light in the polarization direction θ(i, j) in the polarizing pixel Pp(i, j). The color polarization luminance Ipg(i, j) is luminance of green light in the polarization direction θ(i, j) in the polarizing pixel Pp(i, j). The color polarization luminance Ipb(i, j) is luminance of blue light in the polarization direction θ(i, j) in the polarizing pixel Pp(i, j).

Further, since the color pixel Pc is arranged according to the Bayer array, the signal processing unit 18 is able to obtain a full color image by calculating the luminances of the respective colors of the color pixels Pc in accordance with a well-known demosaic process.

As described above, in the CMOS image sensor 10A, since it is possible to arrange the polarizing pixels Pp and the color pixels Pc in the grid form with a high density, the detection accuracy of the polarization information and the color information can be improved. Further, it is possible to obtain the polarized image and the color image of the same resolution. Further, since the color pixels have a pixel array similar to that of a common solid-state image capturing device, it is possible to obtain the color image using a technique similar to the related art without performing a special process.

{Second Array Example of Unit Pixels}

In the first array example of FIG. 3, the color pixels have the Bayer array, but an arbitrary array other than the Bayer array can be used.

Figure 4:
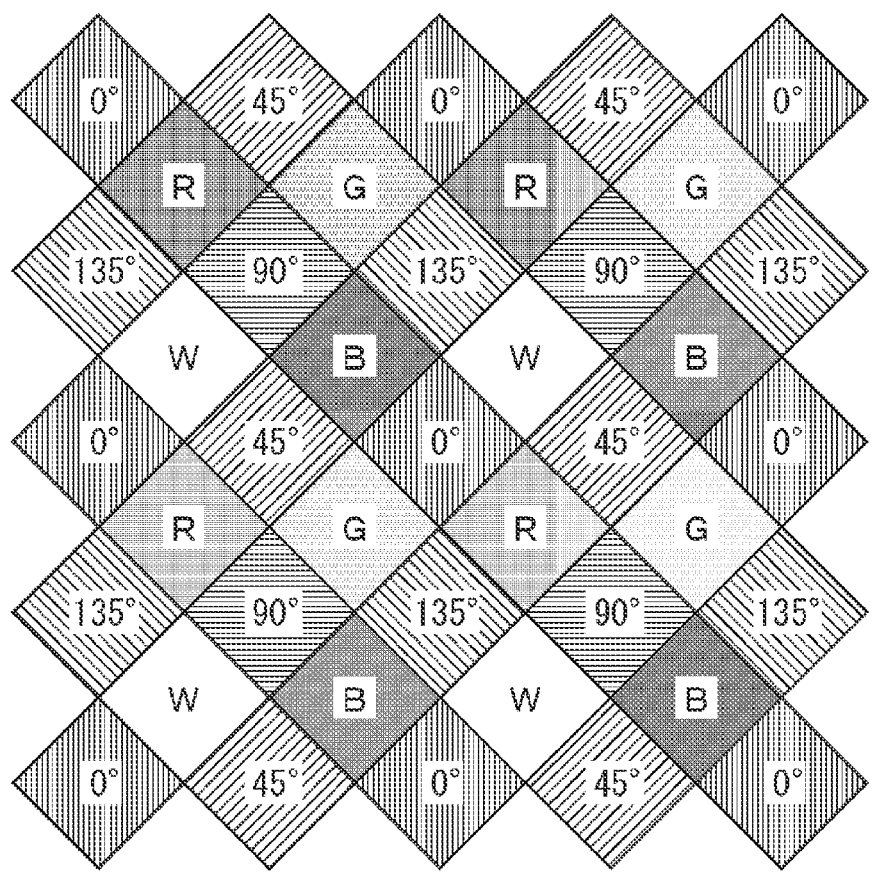
FIG. 4 is a diagram schematically illustrating a second array example of unit pixels.

FIG. 4 schematically illustrates a second array example of the unit pixels in the pixel array unit 11 of the CMOS image sensor 10A in a form similar to that of FIG. 3.

The second array example differs from the first array example of FIG. 3 in that a color pixel to which a letter W is attached in a square (hereinafter referred to as a "W pixel") is arranged instead of the Gb pixel and is similar to the first array example of FIG. 3 in the other points.

For example, the W pixel is a pixel in which a transparent color filter 127 is installed or no color filter 127 is installed. Therefore, the W pixel has higher sensitivity than the R pixel, the G pixel, and the B pixel because the wavelength of the incident light is not limited. Therefore, in the second array example, the sensitivity of the color pixel Pc (the color information) can be improved as compared with the first array example.

<3. Second Embodiment>

Next, a CMOS image sensor 10B which is a second embodiment of the CMOS image sensor 10 of FIG. 1 will be described with reference to FIGS. 5 to 7.

{Third Array Example of Unit Pixels}

Figure 5:
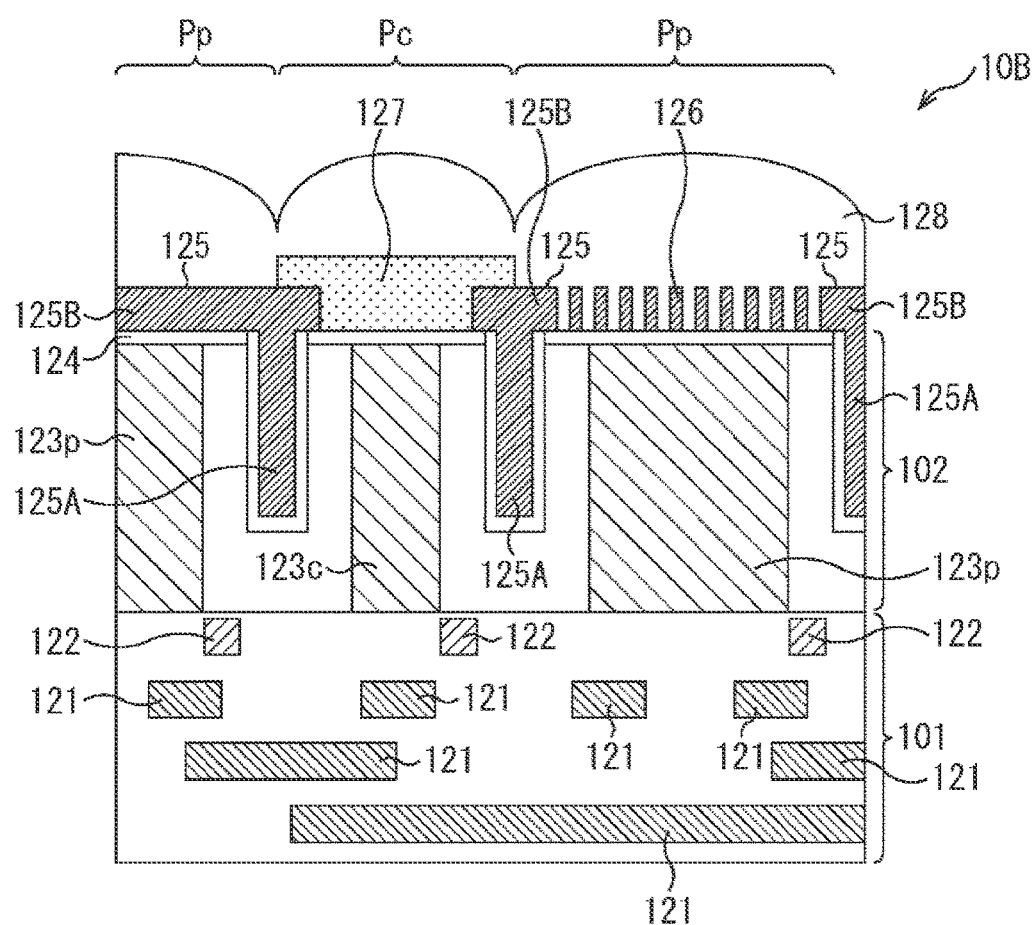
FIG. 5 is a cross-sectional view schematically illustrating a second embodiment of a CMOS image sensor.

FIG. 5 schematically illustrates a configuration example of the CMOS image sensor 10B in a form similar to that of FIG. 2.

The CMOS image sensor 10B of FIG. 5 differs from the CMOS image sensor 10A of FIG. 2 in that the size of the polarizing pixel Pp is larger, and the size of the color pixel Pc is smaller and is similar to the CMOS image sensor 10A in the other points. The photoelectric conversion element 123p of the polarizing pixel Pp is larger than the photoelectric conversion element 123c of the polarizing pixel Pp, and the light receiving area of the photoelectric conversion element 123p is larger than the light receiving area of the photoelectric conversion element 123c.

{First Array Example of Polarizing Pixels Pp and Color Pixels Pc}

Figure 6:
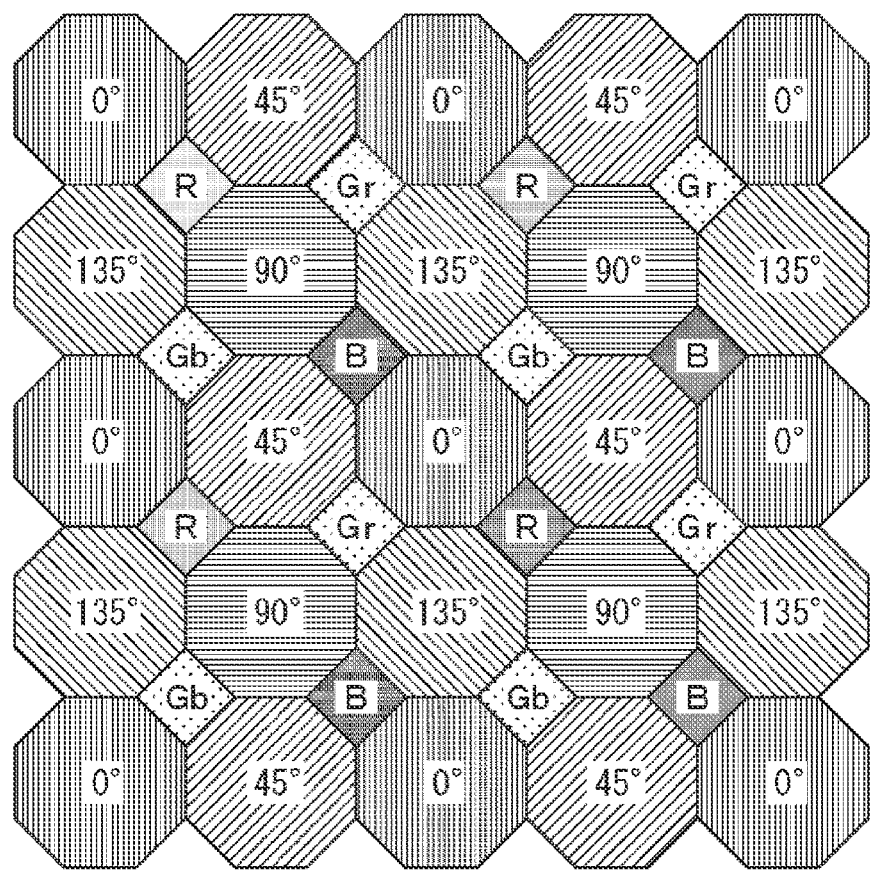
FIG. 6 is a diagram schematically illustrating a third array example of unit pixels.

FIG. 6 schematically illustrates a third array example of the unit pixels in the pixel array unit 11 of the CMOS image sensor 10 B in a form similar to that of FIG. 3.

The third array example differs from the first array example in that the shape and area of the polarizing pixel Pp and the area of the color pixel Pc are different from those of the first array example of FIG. 3 and is similar to the first array example in the other points.

Specifically, the polarizing pixel Pp has a regular octagonal shape in which four corners of a square are cut out in a direction of 45° with respect to the row direction and the column direction. The polarizing pixels Pp comes into contact with the adjacent the polarizing pixels Pp at the side in the row direction or the side in the column direction and are arranged in the row direction and the column direction in the grid form (the matrix form).

The color pixel Pc is arranged in a gap between the polarizing pixels Pp. In other words, the color pixel Pc is a region surrounded by sides of the four adjacent polarizing pixels Pp in the oblique direction and arranged at a position shifted from the polarizing pixel Pp in the row direction and the column direction by a half of a pitch of the polarizing pixel Pp. Therefore, the polarizing pixels Pp and the color pixels Pc are arranged at positions shifted from each other by a ½ pitch in the row direction and the column direction in the grid form (the matrix form). Similarly to the first array example, the color pixel Pc has a shape in which the square is tilted by 45° in the row direction and the column direction. However, the area of the color pixel Pc is smaller than in the first array example.

Accordingly, it is possible to independently design the size of the polarizing pixel Pp and the size of the color pixel Pc. Therefore, it is possible to minimize the size of the pixel array unit 11 while setting an extinction ratio and sensitivity of the polarizing pixel Pp and the sensitivity of the color pixel Pc to desired values.

For example, in a case in which the extinction ratio of the polarizing member 126 of the polarizing pixel Pp is set to 10 or more, it is desirable to arrange the polarizing pixels Pp in the grid form with a pitch of about 3 μm. In this case, the length of the oblique side of the cut portion of the polarizing pixel Pp is about 1.2 μm, and the color pixel Pc is a square having a side of about 1.2 μm.

{Fourth Array Example of Unit Pixels}

Figure 7:
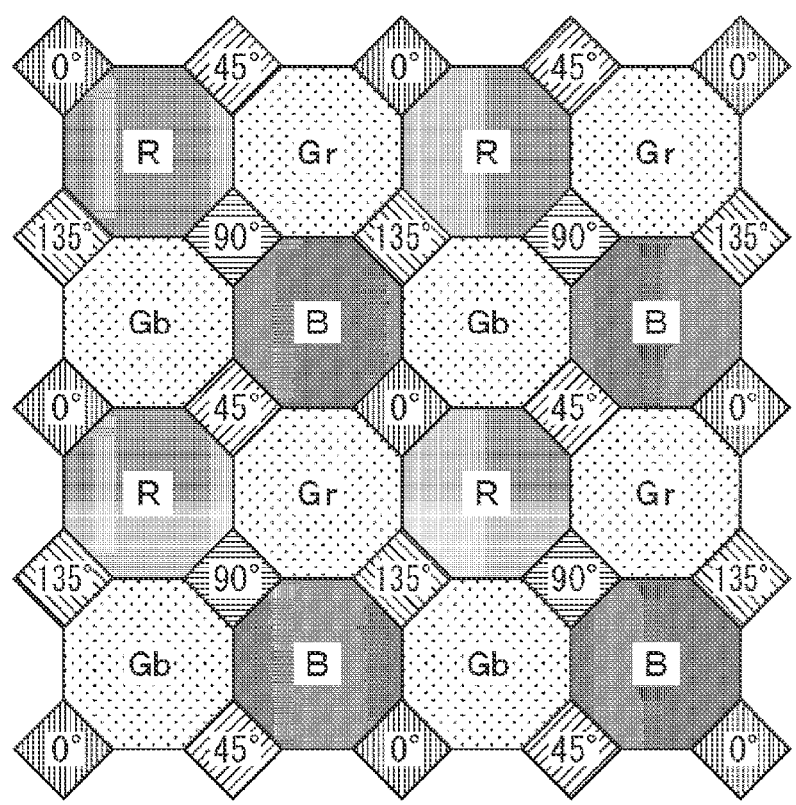
FIG. 7 is a diagram schematically illustrating a fourth array example of unit pixels.

FIG. 7 schematically illustrates a fourth array example of the unit pixels in the pixel array unit 11 of the CMOS image sensor 10 B in a form similar to that of FIG. 3.

The fourth array example of FIG. 7 differs from the third array example in that the shape of the polarizing pixel Pp and the shape of the color pixel Pc are opposite to each other as compared with the third array example of FIG. 6 and is similar to the third array example in the other points.

<4. Third Embodiment>

Next, a CMOS image sensor 10C which is a third embodiment of the CMOS image sensor 10 of FIG. 1 will be described with reference to FIGS. 8 to 13.

{Configuration Example of CMOS Image Sensor 10C}

Figure 8:
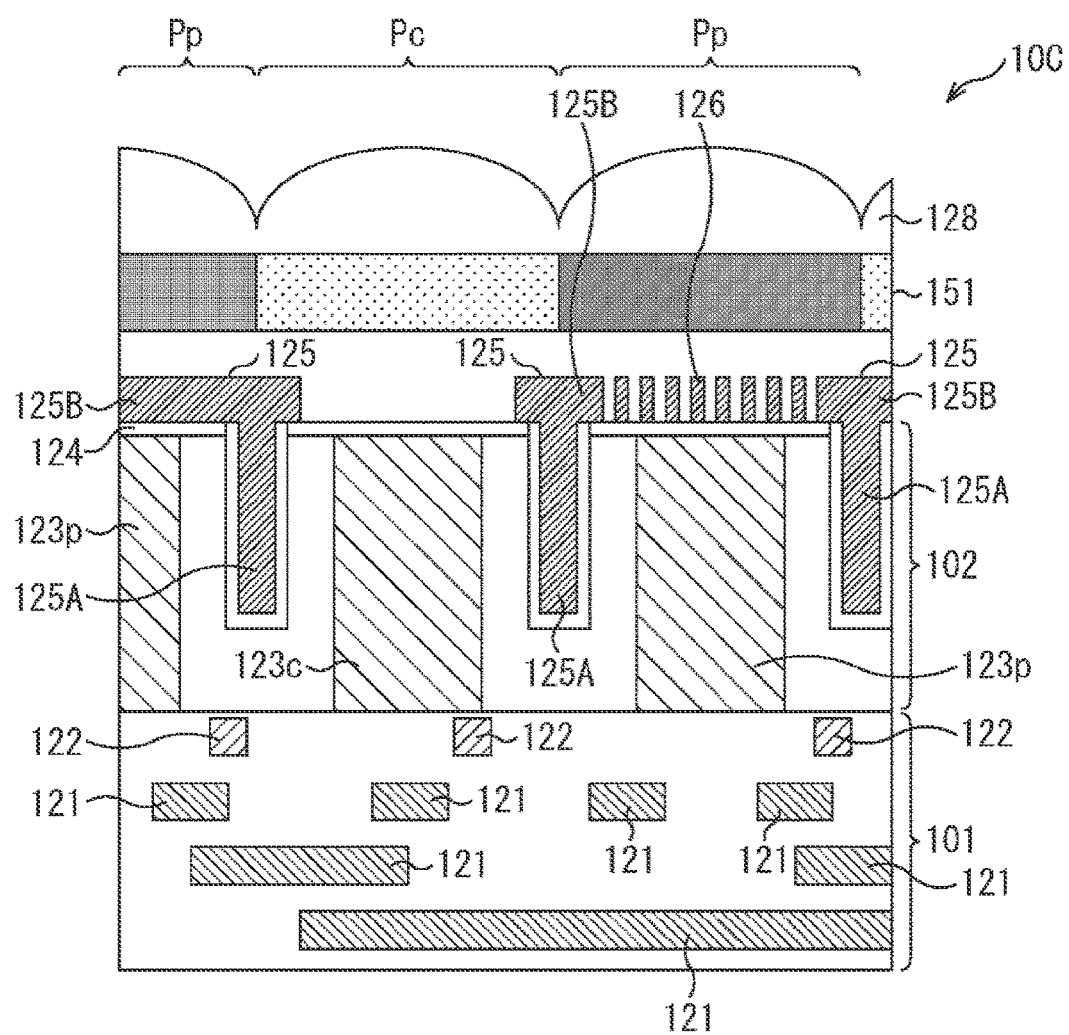
FIG. 8 is a cross-sectional view schematically illustrating a third embodiment of a CMOS image sensor.

FIG. 8 schematically illustrates a configuration example of the CMOS image sensor 10C in a form similar to that of FIG. 2.

The CMOS image sensor 10C differs from the CMOS image sensor 10A of FIG. 2 in that the color filter 127 of the color pixel Pc is removed, and instead, a color filter 151 is installed between the light collecting element 128 and each of the horizontal portion 125B of the light shielding film 125 and the polarizing member 126 and is similar to the CMOS image sensor 10A in the other points.

The color filter 151 is arranged above not only the photoelectric conversion element 123c of the color pixel Pc but also the photoelectric conversion element 123p of the polarizing pixel Pp. Therefore, the polarizing pixel Pp is able to detect not only the polarization information but also the color information.

{Fifth Array Example of Unit Pixels}

Figure 9:
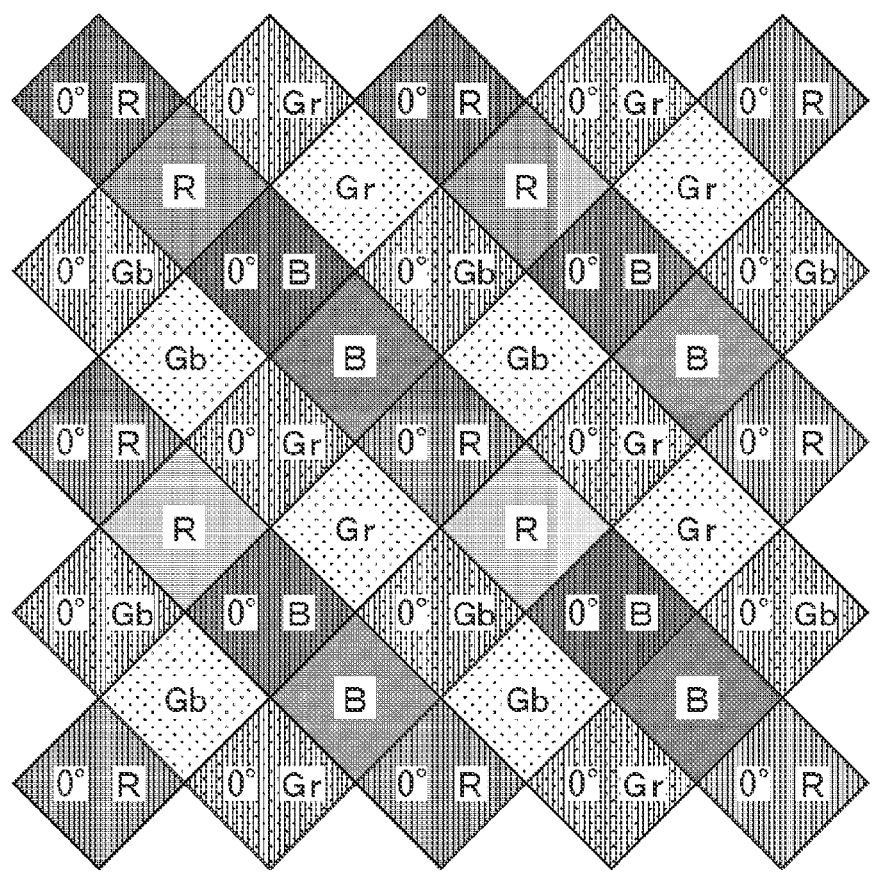
FIG. 9 is a diagram schematically illustrating a fifth array example of unit pixels.

FIG. 9 schematically illustrates a fifth array example of the unit pixels in the pixel array unit 11 of the CMOS image sensor 10C in a form similar to that of FIG. 3.

The fifth array example differs from the first array example of FIG. 3 in that the polarizing pixel Pp is able to detect the color information, and the arrangement of the polarization angle of the polarizing pixel Pp is different and is similar to the first array example in the other points.

Specifically, in the fifth array example, the polarization angle of the polarizing pixel Pp is all 0°. Further, as described above with reference to FIG. 8, since the color filter 151 is installed, all the polarizing pixels Pp are able to detect not only the polarization information but also the color information. The color arrangement of the polarizing pixel Pp follows the Bayer array.

The polarizing pixel Pp has lower sensitivity than the color pixel Pc since as much as the polarizing member 126 is installed. Therefore, for example, in the case of low illuminance, the color image is generated using the pixel signal of the color pixel Pc having high sensitivity, and in the case of high illuminance, the color image is generated using the pixel signal of the polarizing pixel Pp having low sensitivity, and thus it is possible to suppress the occurrence of blown-out highlights or blocked-up shadows, and it is possible to increase the dynamic range of the CMOS image sensor 10C accordingly. Further, for example, it is also possible to synthesize the pixel signal of the color pixel Pc with the pixel signal of the polarizing pixel Pp at a ratio according to the illuminance or the like.

Further, since the color image is generated using the pixel signal of the polarizing pixel Pp, it is possible to easily obtain a polarized color image having a predetermined polarization direction.

{Sixth Array Example of Unit Pixels}

Figure 10:
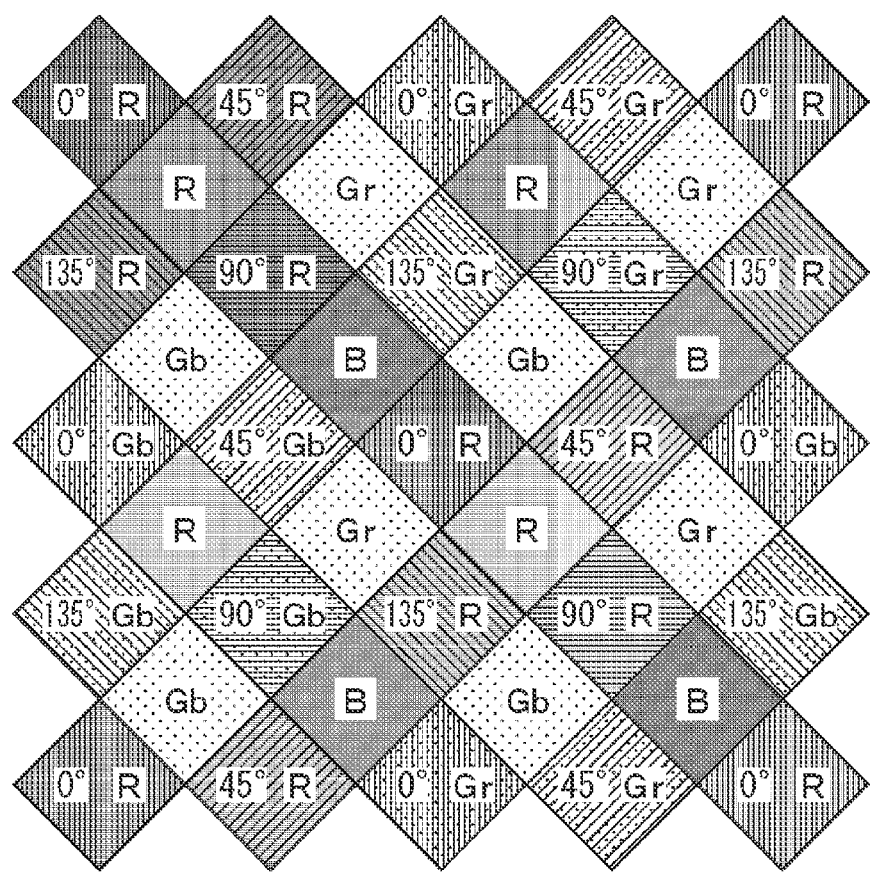
FIG. 10 is a diagram schematically illustrating a sixth array example of unit pixels.

FIG. 10 schematically illustrates a sixth array example of the unit pixels in the pixel array unit 11 of the CMOS image sensor 10C in a form similar to that of FIG. 3.

The sixth array example differs from the fifth array example of FIG. 9 in the arrangement of the polarization angle and the color of the polarizing pixel Pp and is similar to the fifth array example in the other points.

Specifically, the arrangement of the polarization angle of the polarizing pixel Pp is similar to that of the first array example of FIG. 3.

Further, small blocks in which the polarizing pixels Pp of the same color are arranged in a 2×2 matrix form are classified into four types in accordance with to a difference in color, and four types of small blocks are regularly arranged. In other words, the colors of the polarizing pixels Pp in the small block are the same, the colors of the polarizing pixels Pp of the different types of small blocks are different, and the four types of small blocks are regularly arranged. Specifically, a large block in which a small block configured with the polarizing pixels Pp which are the R pixel, a small block configured with the polarizing pixels Pp which are the Gr pixel, a small block configured with the polarizing pixels Pp which are the Gb pixel, and a small block configured with the polarizing pixels Pp which are the B pixel are arranged in a 2×2 matrix form is defined as one unit, and the large blocks are periodically arranged in the row direction and the column direction in the grid form (the matrix form). Therefore, the color arrangement of the polarizing pixels Pp follows the Bayer array in terms of small block units.

Therefore, in the sixth array example, it is possible to increase the dynamic range of the CMOS image sensor 10C, similarly to the fifth array example of FIG. 9. Further, since it is possible to obtain the polarization information of four types of angles for each color, the luminance in each polarization direction indicated by the above Formula (1) can be obtained for each color. Furthermore, the polarizing pixel Pp is able to acquire both the polarization information and the color information, it is easy to separate specular reflection and diffuse reflection of the polarization information.

{Seventh Array Example of Unit Pixels}

Figure 11:
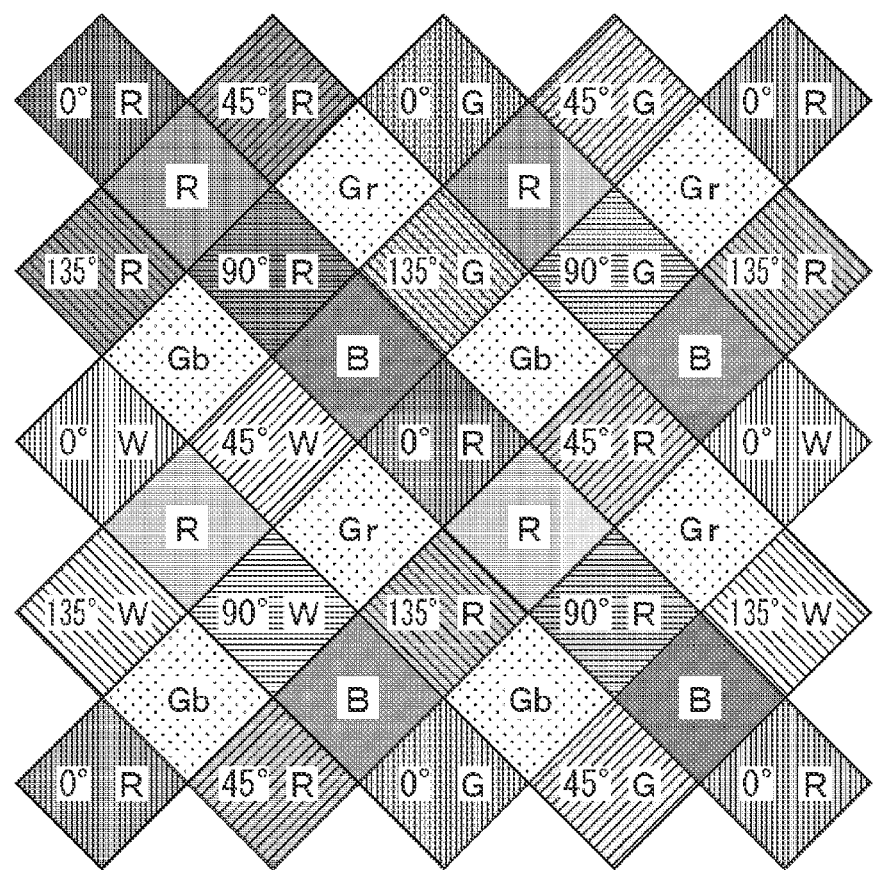
FIG. 11 is a diagram schematically illustrating a seventh array example of unit pixels.

FIG. 11 schematically illustrates a seventh array example of the unit pixels in the pixel array unit 11 of the CMOS image sensor 10C in a form similar to that of FIG. 3.

The seventh array example differs from the sixth array example of FIG. 10 in the color arrangement of the polarizing pixels Pp, and is similar to the sixth array example in the other points. Specifically, the polarizing pixel Pp which is the W pixel is arranged at a position at which the polarizing pixel Pp which is the Gb pixel is arranged in the sixth array example. Therefore, the sensitivity of the polarizing pixel Pp is improved as compared with the sixth array example.

For example, the W pixel may be arranged instead of the Gb pixel for the color pixel Pc, similarly to the second array example of FIG. 4.

{Eighth Array Example of Unit Pixels}

Figure 12:
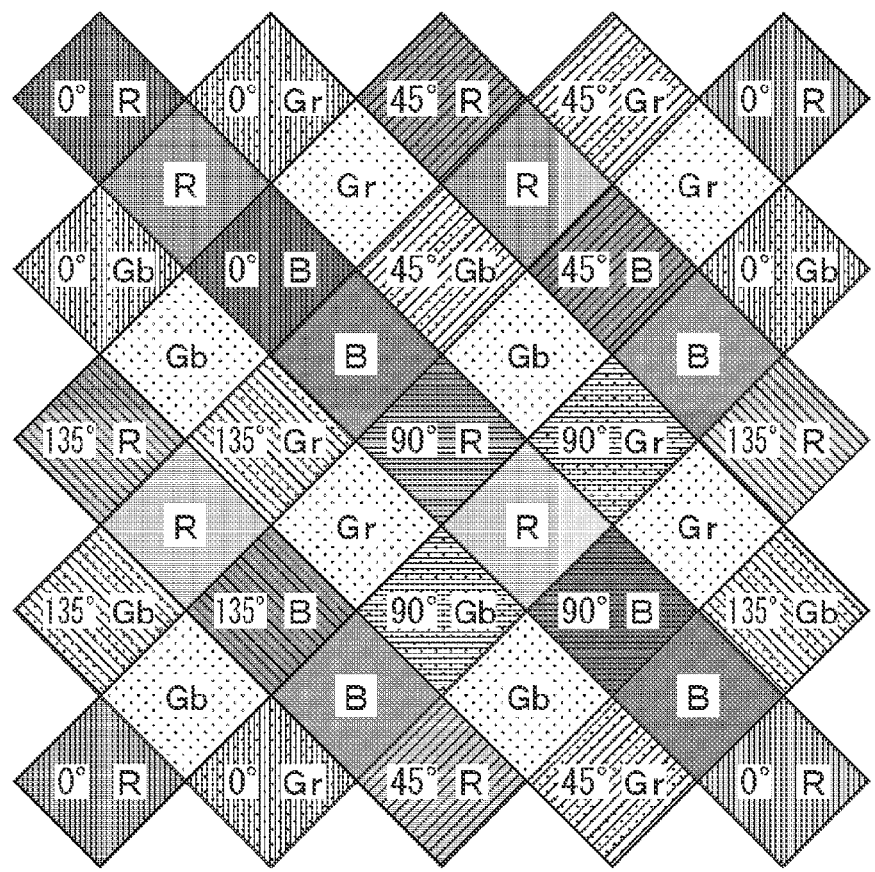
FIG. 12 is a diagram schematically illustrating an eighth array example of unit pixels.

FIG. 12 schematically illustrates an eighth array example of the unit pixels in the pixel array unit 11 of the CMOS image sensor 10C in a form similar to that of FIG. 3.

The eighth array example differs from the fifth array example of FIG. 9 in the arrangement of the polarization angles of the polarizing pixels Pp and is similar to the fifth array example in the other points.

Specifically, small blocks in which the polarizing pixels Pp of the same polarization angle are arranged in a 2×2 matrix form are classified into four types in accordance with according to a difference in a polarization angle, and four small blocks are regularly arranged. In other words, the polarization angles of the polarizing pixels Pp in the small block are the same, the polarization angles of the polarizing pixel Pp of different types of small blocks are different, and the four small blocks are regularly arranged. Specifically, a large block in which a small block configured with the 0° pixels, a small block configured with the 45° pixels, a small block configured with the 90° pixels, and a small block configured with the 135° pixel are arranged in a 2×2 matrix form is defined as one unit, and the large blocks are periodically arranged in the row direction and the column direction in the grid form (the matrix form).

Accordingly, in the eighth array example, it is possible to increase the dynamic range of the CMOS image sensor 10C, similarly to the fifth array example of FIG. 9. Further, it is possible to acquire the color information of each color for each polarization angle.

{Ninth Array Example of Unit Pixels}

Figure 13:
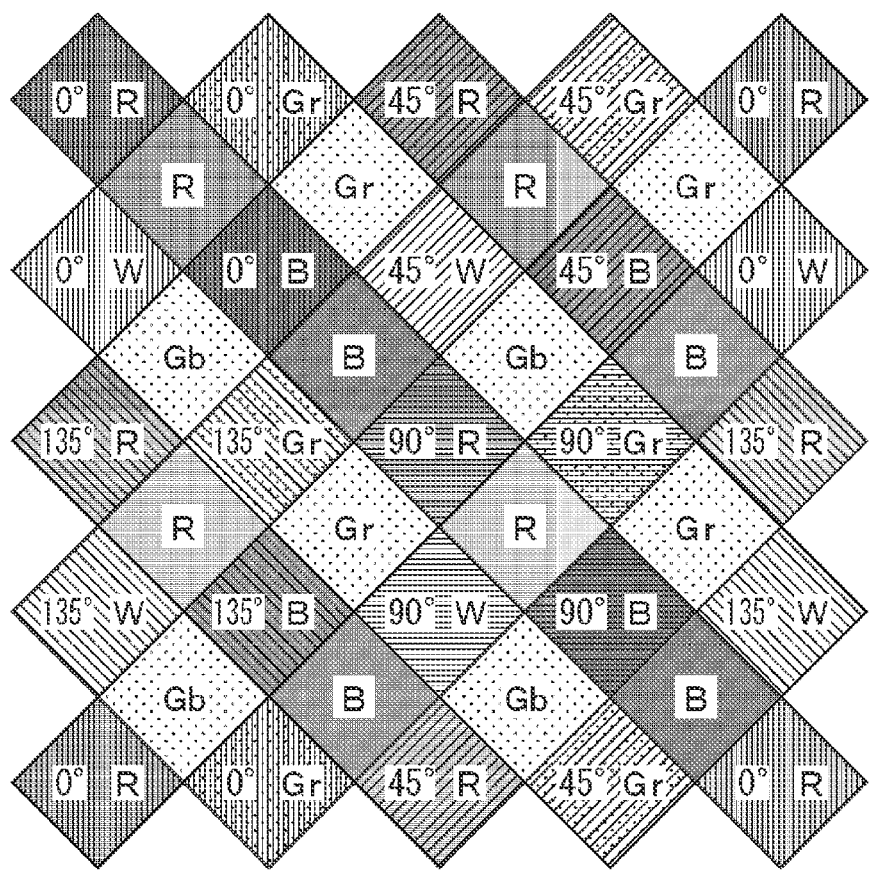
FIG. 13 is a diagram schematically illustrating a ninth array example of unit pixels.

FIG. 13 schematically illustrates a ninth array example of the unit pixels in the pixel array unit 11 of the CMOS image sensor 10C in a form similar to that of FIG. 3.

The ninth array example differs from the eighth array example of FIG. 12 in the color arrangement of the polarizing pixel Pp and is similar to the eighth array example in the other points. Specifically, the polarizing pixel Pp which is the W pixel is arranged at a position at which the polarizing pixel Pp which is the Gb pixel is arranged in the eighth array example. Therefore, the sensitivity of the polarizing pixel Pp is improved as compared with the eighth array example.

For example, the W pixel may be arranged instead of the Gb pixel for the color pixel Pc, similarly to the second array example of FIG. 4.

<5. Fourth Embodiment>

Next, a CMOS image sensor 10D which is a fourth embodiment of the CMOS image sensor 10 of FIG. 1 will be described with reference to FIG. 14.

{Configuration Example of CMOS Image Sensor 10D}

Figure 14:
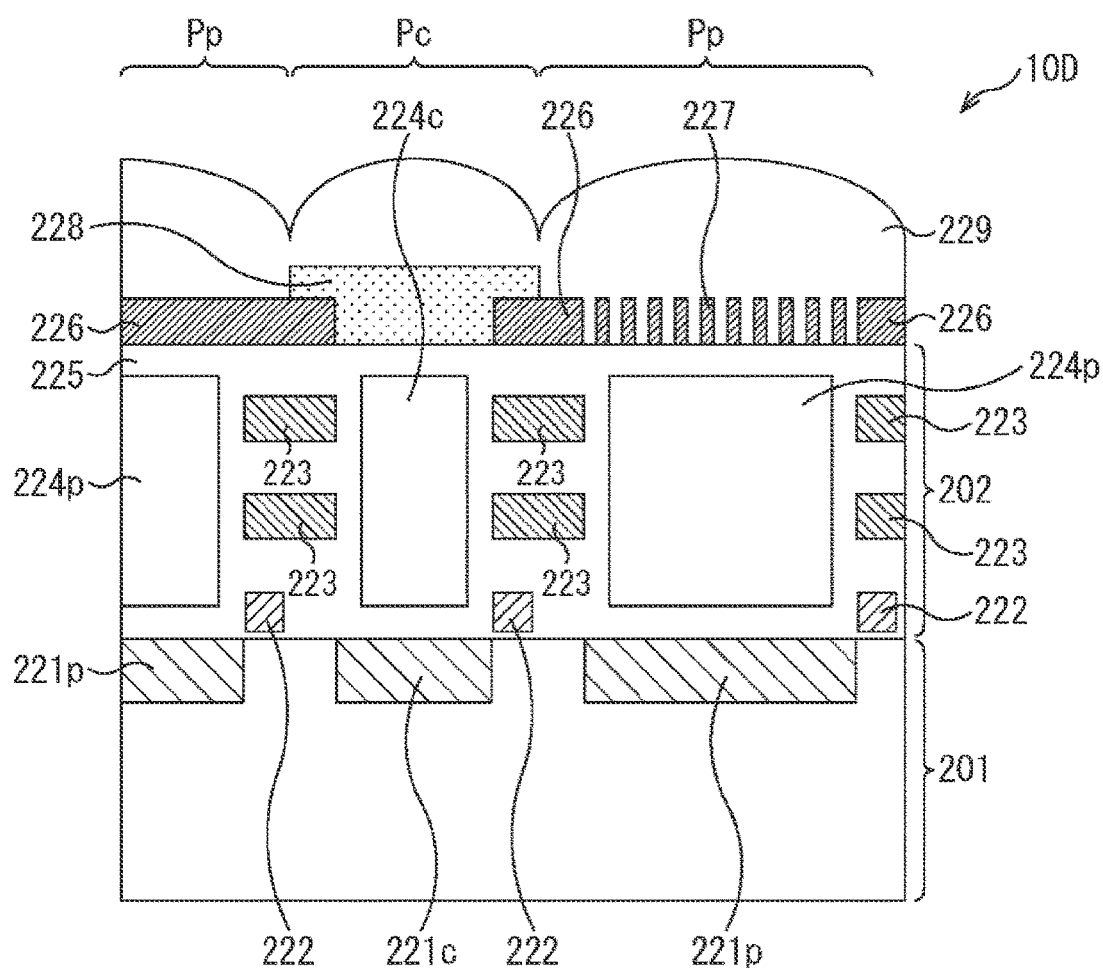
FIG. 14 is a cross-sectional view schematically illustrating a fourth embodiment of a CMOS image sensor.

FIG. 14 schematically illustrates a configuration example of a CMOS image sensor 10C in a form similar to that of FIG. 2.

Unlike the CMOS image sensors 10A to 10C, the CMOS image sensor 10D has a top surface irradiation type structure in which light is incident from the front surface side on which a wiring layer 202 of a semiconductor substrate 201 is stacked. Hereinafter, the front surface of the semiconductor substrate 201 is referred to as an "incident surface" or a "light receiving surface."

In this example, the size of the polarizing pixel Pp is larger than the size of the color pixel Pc, similarly to the CMOS image sensor 10B o FIG. 5. Here, it is also possible to cause the size of the polarizing pixel Pp to be equal to the size of the color pixel Pc or cause the size of the color pixel Pc to be larger than the size of the polarizing pixel Pp.

In the vicinity of the incident surface of the semiconductor substrate 201, a photoelectric conversion element 221p is formed in the area of the polarizing pixel Pp, and a photoelectric conversion element 221c is formed in the area of the color pixel Pc. There is no structural difference between the photoelectric conversion element 221p and the photoelectric conversion element 221c, and each of the photoelectric conversion element 221p and the photoelectric conversion element 221c is configured with, for example, a photodiode. Further, the photoelectric conversion element 221p is larger than the photoelectric conversion element 221c.

Hereinafter, in a case in which it is unnecessary to distinguish the photoelectric conversion element 221p and the photoelectric conversion element 221c individually, they are referred to simply as a photoelectric conversion element 221.

In the wiring layer 202, a gate electrode 222 is formed for each pixel in the vicinity of the boundary with the semiconductor substrate 201. Further, in the wiring layer 202, wirings 223 are stacked in an insulating film 225 over a plurality of layers. However, the wiring 223 is formed between a pixel and a pixel and not formed above each of the photoelectric conversion elements 221.

A core/clad type waveguide 224p is formed above the photoelectric conversion element 221p in the wiring layer 202. The waveguide 224p increases the light collection efficiency of the polarizing pixel Pp by guiding light to be incident on the polarizing pixel Pp to the photoelectric conversion element 221p. Similarly, a core/clad type waveguide 224c is formed above the photoelectric conversion element 221c in the wiring layer 202. The waveguide 224c increases the light collection efficiency of the color pixel Pc by guiding light to be incident on the color pixel Pc to the photoelectric conversion element 221c.

A light shielding film 226, a polarizing member 227, and a color filter 228 are formed on the top surface of the insulating film 225 in the wiring layer 202.

The light shielding film 226 covers the top surface of the wiring layer 202, and opening portions are formed above the photoelectric conversion element 221p and the photoelectric conversion element 221c. Therefore, the light shielding film 226 is formed to fill a space between the adjacent pixels. Incidence of light from an adjacent pixel is suppressed by the light shielding film 226.

The polarizing member 227 is formed in the opening portion above the photoelectric conversion element 221p of the light shielding film 226 and covers the top surface (the incident surface) of the photoelectric conversion element 221p. For example, the polarizing member 227 is configured with a wire grid polarizer, similarly to the polarizing member 126 of FIG. 2.

The color filter 228 is formed in the opening portion above the photoelectric conversion element 221c of the light shielding film 226 and covers the top surface (the incident surface) of the photoelectric conversion element 221c. The color filter 228 is configured with an R filter that transmits light of a red wavelength range, a G filter that transmits light of a green wavelength range, or a B filter that transmits light of a blue wavelength range.

A light collecting element 229 is formed above the light shielding film 226, the polarizing member 227, and the color filter 228 with an interlayer insulating film interposed therebetween (not illustrated). The light collecting element 229 is configured with, for example, an on-chip microlens, and collects light so that the incident light is incident on the polarizing member 227 or the color filter 228.

<6. Modified Examples>

Next, a modified example of the present technology described above will be described.

{Modified Example Related to Arrangement of Unit Pixels}

The shape of the unit pixel (the polarizing pixel Pp and the color pixel Pc) described above with reference to FIGS. 3, 4, 6, 7, and 9 to 13 is one example, and modification can be made as necessary.

For example, in FIG. 3 and the like, the shapes of the unit pixel may be a rhombic shape other than a square.

Further, for example, in FIGS. 6 and 7, the shape of the unit pixel may be an octagon other than a regular octagon. For example, the shape of the unit pixel may be an octagon in which sides in the row direction and the column direction have different lengths from sides in the oblique direction, an octagon in which four corners of a square are cut at an angle different from 45°, or an octagon in which four corners of a rectangle are cut. The shape of the rectangular unit pixel also changes in accordance with the change in the shape of the octagonal unit pixel.

Further, for example, the shape of the unit pixel may be a circular shape, a hexagonal shape, or the like.

In the above description, the example in which the polarizing pixel Pp and the color pixel Pc are arranged at positions shifted from each other by a ½ pitch has been described, but the polarizing pixel Pp and the color pixel Pc may be arranged at positions shifted by a pitch having a value different from ½.

Further, the above-described first to ninth array examples may be combined within a possible range.

{Modified Example Related to Type of Polarization Angle}

In the above description, the example in which the polarization angles of the polarizing pixels Pp (the angles of the transmission axes of the polarizing members) are mainly set to 0, 45, 90, and 135 has been described, but a combination of polarization angles or the number of types may be arbitrarily changed.

For example, the polarization angles of the polarizing pixels Pp (the angles of the transmission axes) may be set to types of 180/θ having a difference of θ therebetween, and the polarizing pixels Pp of types of 180/θ may be arranged regularly.

Further, when the combination of the polarization angles or the number of types is changed, for example, types, arrangements, or the like of small blocks of each polarization angle of the polarizing pixel Pp described above with reference to FIGS. 12 and 13 are also changed.

{Modification Example Related to Type of Color}

In the above description, the example in which types of colors of the color filters are three types of R, B or four types of R, B, and W has been described, but a combination of colors or the number of types may be changed. For example, three types of M (magenta), Y (yellow), and C (cyan), or four types of M, Y, C, and W may be used.

Further, when the combination of the colors of the color filters or the number of types of the color filters is changed, for example, types, arrangements, or the like of small blocks of each color of the polarizing pixel Pp described above with reference to FIGS. 10 and 11 are also changed.

{Other Modified Examples}

For example, in the CMOS image sensor 10D of FIG. 14, either or both of the waveguide 224p and the waveguide 224c may be omitted.

Further, for example, in the above description, the example in which the polarizing member 126 and the color filter 127 of FIGS. 2 and 5 and the polarizing member 227 and the color filter 228 of FIG. 14 are arranged on the same plane (the same position in an optical axis direction) has been described, but the polarizing member 126 and the color filter 127 of FIGS. 2 and 5 and the polarizing member 227 and the color filter 228 of FIG. 14 may be arranged at different positions in the optical axis direction. For example, the polarizing member 126 (or the polarizing member 227) may be arranged above or below the color filter 127 (or the color filter 228) in the optical axis direction.

Further, in the present technology, the color information may be detected through a means other than the color filter. For example, the color information may be detected using an organic photoelectric conversion film.

Further, in the present technology, the polarization information may be detected through a means other than the polarizing member.

Further, in the above embodiment, the case in which the present invention is applied to the CMOS image sensor in which the unit pixels are arranged in the matrix form has been described as an example, but the present technology is not limited to the application to the CMOS image sensor. In other words, the present technology can be applied to all solid-state image capturing devices of an XY address scheme in which unit pixels are two-dimensionally arranged in a matrix form.

The solid-state image capturing device may have a form in which it is formed as a single chip or may have a modular form having an imaging function in which an imaging unit and a signal processing unit or an optical system are packaged together.

<7. Use Examples of Solid-state Image Capturing Device>

Figure 15:
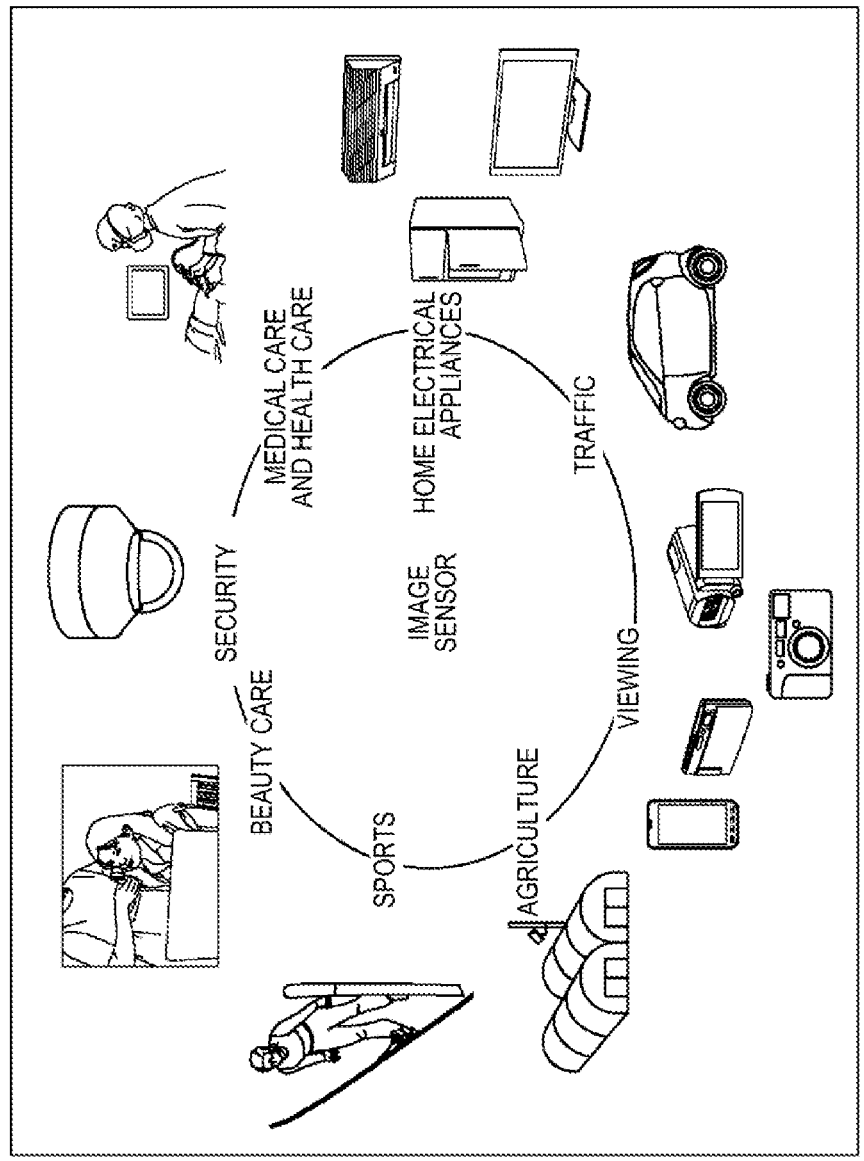
FIG. 15 is a diagram illustrating a use example of a solid-state image capturing device.

FIG. 15 is a diagram illustrating use examples in which the above-described solid-state image capturing device is used.

The above-described solid-state image capturing device can be used for, for example, various cases in which light such as visible light, infrared light, ultraviolet light, or X-rays is detected as follows.

Devices that take images used for viewing, such as a digital camera and a portable appliance with a camera function.

Devices used for traffic, such as an in-vehicle sensor that takes images of the front and the back of a car, surroundings, the inside of the car, and the like, a monitoring camera that monitors travelling vehicles and roads, and a distance sensor that measures distances between vehicles and the like, which are used for safe driving (e.g., automatic stop), recognition of the condition of a driver, and the like.

Devices used for home electrical appliances, such as a TV, a refrigerator, and an air conditioner, to takes images of a gesture of a user and perform appliance operation in accordance with the gesture.

Devices used for medical care and health care, such as an endoscope and a device that performs angiography by reception of infrared light.

Devices used for security, such as a monitoring camera for crime prevention and a camera for personal authentication.

Devices used for beauty care, such as skin measurement equipment that takes images of the skin and a microscope that takes images of the scalp.

Devices used for sports, such as an action camera and a wearable camera for sports and the like.

Devices used for agriculture, such as a camera for monitoring the condition of the field and crops.

{Image Capturing Device}

Figure 16:
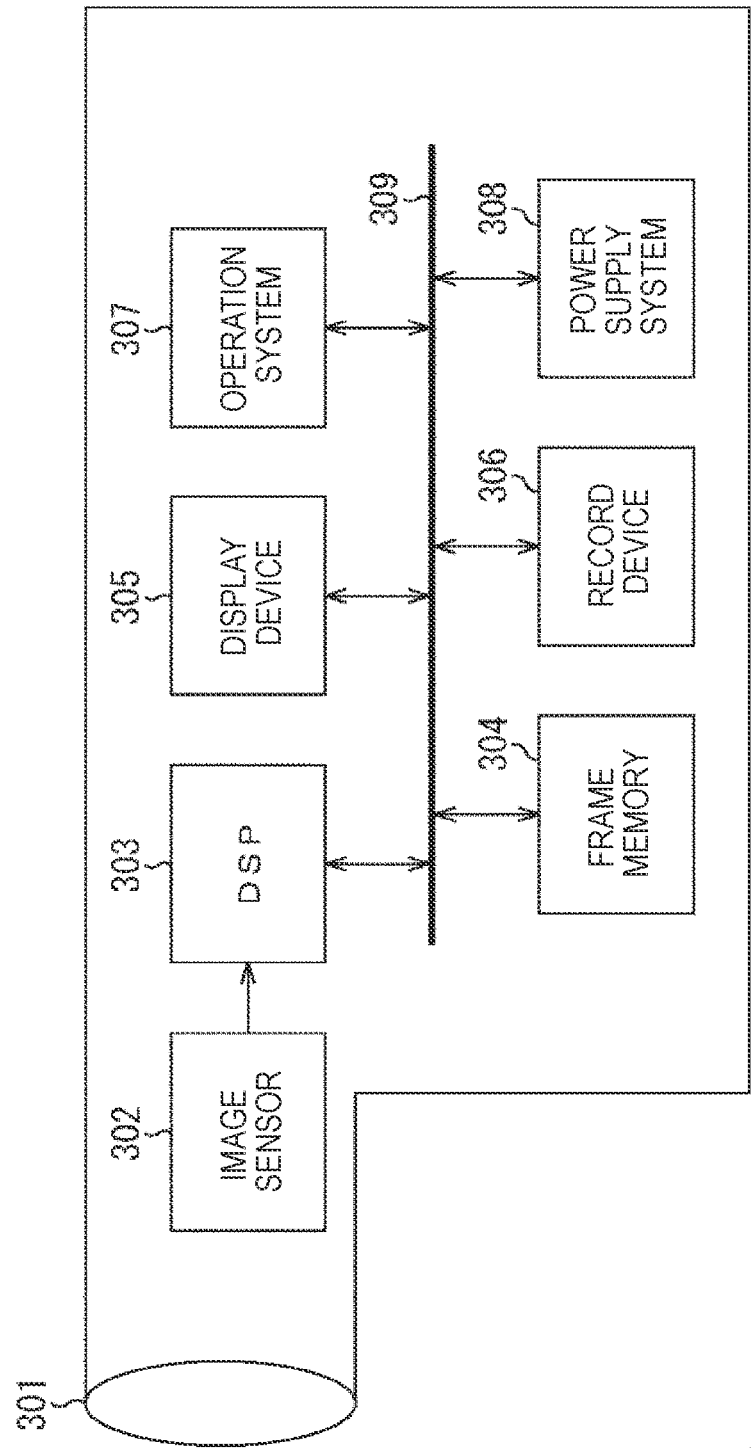
FIG. 16 is a block diagram illustrating a configuration example of an electronic device.

FIG. 16 is an example of a block diagram illustrating an exemplary configuration of the image capturing device (a camera device) as an example of an electronic device to which the present technology is applied.

As illustrated in FIG. 16, the image capturing device includes an optical system that includes a lens group 301 or the like, an image sensor 302, a DSP circuit 303 which is a camera signal processing unit, a frame memory 304, a display device 305, a record device 306, an operation system 307, and a power supply system 308. Then, the DSP circuit 303, the frame memory 304, the display device 305, the record device 306, the operation system 307, and the power supply system 308 are connected to each other via a bus line 309.

The lens group 301 accepts an incoming light (image light) from an imaged object and forms an image on an imaging surface of the image sensor 302. The image sensor 302 converts the light amount of the incoming light by which an image is formed on the imaging surface by the lens group 301, to the electrical signal in each pixel and outputs it as a pixel signal.

The display device 305 is a panel display device such as a liquid crystal display device and an organic electro luminescence (EL) display device, and displays a moving image or a still image captured by the image sensor 302. The record device 306 records the moving image or the still image captured by the image sensor 302, in a recording medium such as a memory card, a video tape, and a digital versatile disk (DVD).

The operation system 307 issues an operation command with regard to various functions of the present image capturing device 300, under the operation by the user. The power supply system 308 supplies various types of power supplies, which are operation power supplies of the DSP circuit 303, the frame memory 304, the display device 305, the record device 306, and the operation system 307, to these supply targets, as appropriate.

The image capturing device is applied to camera modules for mobile devices such as video cameras, digital still cameras, smartphones, mobile phones, or the like. In the image capturing device, the solid-state image capturing device according to the embodiments described above can be used as the image sensor 302. Accordingly, the image quality of the image capturing device can be improved.

An embodiment of the disclosure is not limited to the embodiments described above, and various changes and modifications may be made without departing from the scope of the disclosure.

Additionally, the present technology may also be configured as below.

(1)

A solid-state image capturing device, including
a pixel array unit including
a plurality of polarizing pixels configured to detect polarization information, and
a plurality of color pixels configured to detect color information,
in which the polarizing pixels are arranged in a row direction and a column direction in a grid form, and
the color pixels are arranged in the row direction and the column direction in the grid form between the polarizing pixels that are adjacent, at positions shifted from the polarizing pixels in the row direction and the column direction.

(2)

The solid-state image capturing device according to (1), in which sizes of the polarizing pixels are different from sizes of the color pixels.

(3)

The solid-state image capturing device according to (2), in which the larger pixels among the polarizing pixels and the color pixels each have an octagonal shape made by cutting four corners of a rectangle, and
the smaller pixels among the polarizing pixels and the color pixels are each arranged in a region surrounded by sides of four adjacent larger pixels in oblique directions.

(4)

The solid-state image capturing device according to (1), in which the polarizing pixels and the color pixels have rhombic shapes of the same size.

(5)

The solid-state image capturing device according to any of (1) to (4),
in which the 180/θ number of types of the polarizing pixels in which angles of transmission axes differ by θ° are regularly arranged.

(6)

The solid-state image capturing device according to (5), in which blocks each in which the polarizing pixels in which the angles of the transmission axes differ by 45° are arranged in a 2×2 matrix form are arranged in the row direction and the column direction in the grid form.

(7)

The solid-state image capturing device according to (5) or (6),
in which a plurality of types of blocks each including a plurality of polarizing pixels are regularly arranged, and
the angles of the transmission axes of the polarizing pixels in the block are the same, and the angles of the transmission axes of the polarizing pixels of different types of blocks are different.

(8)

The solid-state image capturing device according to any of (1) to (7),
in which color filters are installed in the polarizing pixels, and
colors of the color filters are regularly arranged.

(9)

The solid-state image capturing device according to (8), in which a plurality of types of blocks each including a plurality of the polarizing pixels are regularly arranged, and
the colors of the color filters in the block are the same, and the colors of the color filters of different types of blocks are different.

(10)

The solid-state image capturing device according to (8) or (9),
in which the color filter that is transparent is installed or not installed in a part of the polarizing pixels.

(11)

The solid-state image capturing device according to any of (1) to (10),
in which polarizing members installed in the polarizing pixels and color filters installed in the color pixel are arranged on the same plane.

(12)

The solid-state image capturing device according to any of (1) to (10),
in which polarizing members installed in the polarizing pixels and color filters installed in the color pixels are arranged at different positions in an optical axis direction.

(13)

The solid-state image capturing device according to any of (1) to (12),
in which polarizing members installed in the polarizing pixels are formed on a surface of a side of a semiconductor substrate on which light is incident, photoelectric conversion elements of the polarizing pixels being formed in the semiconductor substrate.

(14)

The solid-state image capturing device according to any of (1) to (12),
in which a waveguide is formed in at least one of a space between a polarizing member and a photoelectric conversion element constituting the polarizing pixel and a space between a color filter and a photoelectric conversion element constituting the color pixel.

(15)

The solid-state image capturing device according to any of (1) to (14),
in which a trench is formed between pixels, and a light shielding film is embedded in the trench.

(16)

The solid-state image capturing device according to any of (1) to (15),
in which the polarizing pixels and the color pixels are connected to different row signal lines and different column signal lines.

(17)

The solid-state image capturing device according to any of (1) to (16),
in which the color pixels are arranged at positions shifted from the polarizing pixels in the row direction and the column direction by half of a pitch of the polarizing pixels.

(18)

The solid-state image capturing device according to any of (1) to (17), further including
a signal processing unit configured to calculate luminance of light in each polarization direction in the color pixels on the basis of luminance of a plurality of the polarizing pixels around the color pixels.

(19)

The solid-state image capturing device according to any of (1) to (18), further including
a signal processing unit configured to calculate luminance of light of each color of the polarizing pixels in a polarization direction in the polarizing pixels on the basis of luminance of a plurality of the color pixels around the polarizing pixels.

(20)

An electronic device, including:
a solid-state image capturing device;
a signal processing unit configured to process a signal output from the solid-state image capturing device,
in which the solid-state image capturing device includes
a pixel array unit including
a plurality of polarizing pixels configured to detect polarization information, and
a plurality of color pixels configured to detect color information,
the polarizing pixels are arranged in a row direction and a column direction in a grid form, and
the color pixels are arranged in the row direction and the column direction in the grid form between the polarizing pixels that are adjacent, at positions shifted from the polarizing pixels in the row direction and the column direction.

REFERENCE SIGNS LIST 10, 10A to 10D CMOS image sensor
11 pixel array unit
12 vertical driving unit
13 column processing unit
14 horizontal driving unit
15 system control unit
16 pixel drive line
17 vertical signal line
18 signal processing unit
101 wiring layer
102 semiconductor substrate
123p, 123c photoelectric conversion element
125 light shielding film
126 polarizing member
127 color filter
201 wiring layer
202 semiconductor substrate
221p, 221c photoelectric conversion element
224p, 224c waveguide
226 light shielding film
227 polarizing member
228 color filter
Pp polarizing pixel
Pc color pixel
302 image sensor

What is claimed is:

1. A solid-state image capturing device, comprising a pixel array unit including:
a plurality of polarizing pixels configured to detect polarization information; and
a plurality of color pixels configured to detect color information,
wherein the polarizing pixels are arranged in a row direction and a column direction in a grid form,
wherein the color pixels are arranged in the row direction and the column direction in the grid form between the polarizing pixels that are adjacent, at positions shifted from the polarizing pixels in the row direction and the column direction,
wherein sizes of the polarizing pixels are different from sizes of the color pixels,
wherein the larger pixels among the polarizing pixels and the color pixels each have an octagonal shape made by cutting four corners of a rectangle, and
wherein the smaller pixels among the polarizing pixels and the color pixels are each arranged in a region surrounded by sides of four adjacent larger pixels in oblique directions.

2. The solid-state image capturing device according to claim 1, wherein color filters are installed in the polarizing pixels, and colors of the color filters are regularly arranged.

3. The solid-state image capturing device according to claim 2,
wherein a plurality of types of blocks each including a plurality of the polarizing pixels are regularly arranged, and
the colors of the color filters in the block are the same, and the colors of the color filters of different types of blocks are different.

4. The solid-state image capturing device according to claim 1, wherein polarizing members installed in the polarizing pixels and color filters installed in the color pixel are arranged on the same plane.

5. The solid-state image capturing device according to claim 1, wherein polarizing members installed in the polarizing pixels and color filters installed in the color pixels are arranged at different positions in an optical axis direction.

6. The solid-state image capturing device according to claim 1, wherein polarizing members installed in the polarizing pixels are formed on a surface of a side of a semiconductor substrate on which light is incident, photoelectric conversion elements of the polarizing pixels being formed in the semiconductor substrate.

7. The solid-state image capturing device according to claim 1, wherein a waveguide is formed in at least one of a space between a polarizing member and a photoelectric conversion element constituting the polarizing pixel and a space between a color filter and a photoelectric conversion element constituting the color pixel.

8. The solid-state image capturing device according to claim 1, wherein a trench is formed between pixels, and a light shielding film is embedded in the trench.

9. The solid-state image capturing device according to claim 1, wherein the polarizing pixels and the color pixels are connected to different row signal lines and different column signal lines.

10. The solid-state image capturing device according to claim 1, wherein the color pixels are arranged at positions shifted from the polarizing pixels in the row direction and the column direction by half of a pitch of the polarizing pixels.

11. The solid-state image capturing device according to claim 1, further comprising a signal processing unit configured to calculate luminance of light in each polarization direction in the color pixels on the basis of luminance of a plurality of the polarizing pixels around the color pixels.

12. The solid-state image capturing device according to claim 1, further comprising a signal processing unit configured to calculate luminance of light of each color of the polarizing pixels in a polarization direction in the polarizing pixels on the basis of luminance of a plurality of the color pixels around the polarizing pixels.

13. A solid-state image capturing device, comprising a pixel array unit including:
- a plurality of polarizing pixels configured to detect polarization information; and
- a plurality of color pixels configured to detect color information;
- wherein the polarizing pixels are arranged in a row direction and a column direction in a grid form,
- wherein the color pixels are arranged in the row direction and the column direction in the grid form between the polarizing pixels that are adjacent, at positions shifted from the polarizing pixels in the row direction and the column direction,
- wherein 180/θ number of types of the polarizing pixels in which angles of transmission axes differ by θ° are regularly arranged,
- wherein a plurality of types of blocks each including a plurality of polarizing pixels are regularly arranged, and
- wherein the angles of the transmission axes of the polarizing pixels in the block are the same, and the angles of the transmission axes of the polarizing pixels of different types of blocks are different.

14. The solid-state image capturing device according to claim 13, wherein the polarizing pixels and the color pixels have rhombic shapes of the same size.

15. The solid-state image capturing device according to claim 13, wherein blocks each in which the polarizing pixels in which the angles of the transmission axes differ by 45° are arranged in a 2×2 matrix form are arranged in the row direction and the column direction in the grid form.

* * * * *